(12) United States Patent
Bailey et al.

(10) Patent No.: US 10,362,705 B2
(45) Date of Patent: Jul. 23, 2019

(54) LIGHTWEIGHT SERVER CHASSIS CONFIGURED FOR MODULAR INSERTION OF CUSTOMER SELECTABLE COMPONENTS FOR DOWNSTREAM ASSEMBLY OF INFORMATION HANDLING SYSTEM AT CUSTOMER LOCATIONS

(71) Applicant: DELL PRODUCTS, L.P., Round Rock, TX (US)

(72) Inventors: Edmond I. Bailey, Cedar Park, TX (US); Walter Carver, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 76 days.

(21) Appl. No.: 14/299,152

(22) Filed: Jun. 9, 2014

(65) Prior Publication Data

US 2015/0359128 A1 Dec. 10, 2015

(51) Int. Cl.
| | |
|---|---|
| H05K 7/14 | (2006.01) |
| H05K 5/02 | (2006.01) |
| H05K 5/03 | (2006.01) |
| H05K 7/20 | (2006.01) |
| H05K 9/00 | (2006.01) |

(52) U.S. Cl.
CPC ...... *H05K 7/1487* (2013.01); *Y10T 29/49004* (2015.01)

(58) Field of Classification Search
CPC ...... H05K 7/1488; H05K 9/0007; H05K 5/03; H05K 9/0067; H05K 5/0239; H05K 5/02; H05K 7/20736; H05K 7/1485; H05K 9/0062; Y10T 29/49004

USPC ......... 361/679.46, 679.02; 174/377; 211/26; 29/592.1; 312/223.2
See application file for complete search history.

(56) References Cited

U.S. PATENT DOCUMENTS

| | | | | |
|---|---|---|---|---|
| 5,107,989 A * | 4/1992 | Becker | ................ | H05K 9/0067 206/720 |
| 5,889,648 A * | 3/1999 | Heavirland | ............. | H02B 1/54 174/50 |
| 6,717,485 B2 * | 4/2004 | Kolb | ...................... | H04B 15/02 174/250 |
| 6,972,949 B1 * | 12/2005 | Helgenberg | ............ | G06F 1/183 361/679.02 |
| 7,916,487 B2 * | 3/2011 | Bitton | ..................... | G06F 21/70 174/50 |
| 8,755,192 B1 * | 6/2014 | Schrempp | ................ | G06F 1/20 361/679.5 |
| 9,445,534 B2 * | 9/2016 | Bailey | ................. | H05K 9/0062 |

(Continued)

*Primary Examiner* — Jerry Wu
*Assistant Examiner* — Stephen S Sul
(74) *Attorney, Agent, or Firm* — Isidore PLLC

(57) ABSTRACT

An information handling system (IHS) includes a lightweight server chassis having a surface that includes a plurality of slots formed within the chassis surface. Each slot is sized to receive a specific compute component of a plurality of different compute components that collectively provide a fully functional IHS. In one embodiment, at least one slot that is formed within the chassis surface is sized to receive a respective one of the more than one type of compute component of a plurality of different compute components. Thereby, an original equipment manufacturer (OEM) can flexibly ship at least portions of the IHS to an end user destination for possible downstream reconfiguration and assembly.

29 Claims, 24 Drawing Sheets

(56) References Cited

U.S. PATENT DOCUMENTS

| | | | |
|---|---|---|---|
| 2003/0048607 A1* | 3/2003 | Ives | G11B 33/08 |
| | | | 361/695 |
| 2010/0265645 A1* | 10/2010 | Wang | G06F 1/181 |
| | | | 361/679.4 |
| 2011/0069458 A1* | 3/2011 | Nakao | H01L 25/072 |
| | | | 361/728 |
| 2012/0146468 A1* | 6/2012 | Uehira | C08B 13/00 |
| | | | 312/223.1 |
| 2012/0229971 A1* | 9/2012 | Mills | H05K 7/1489 |
| | | | 361/679.46 |
| 2013/0265695 A1* | 10/2013 | Canfield | H05K 7/1489 |
| | | | 361/679.01 |
| 2014/0029193 A1* | 1/2014 | Alshinnawi | G06F 1/20 |
| | | | 361/679.47 |

* cited by examiner

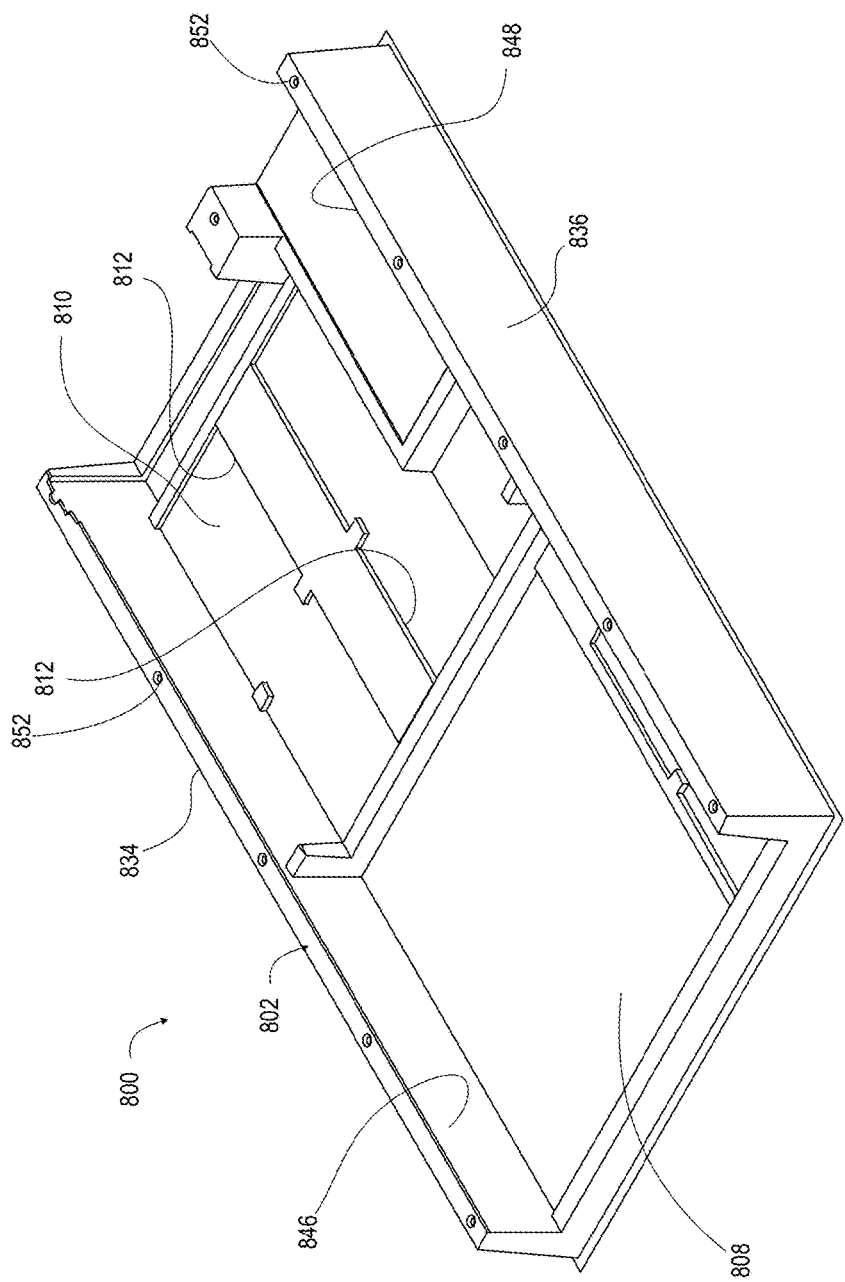

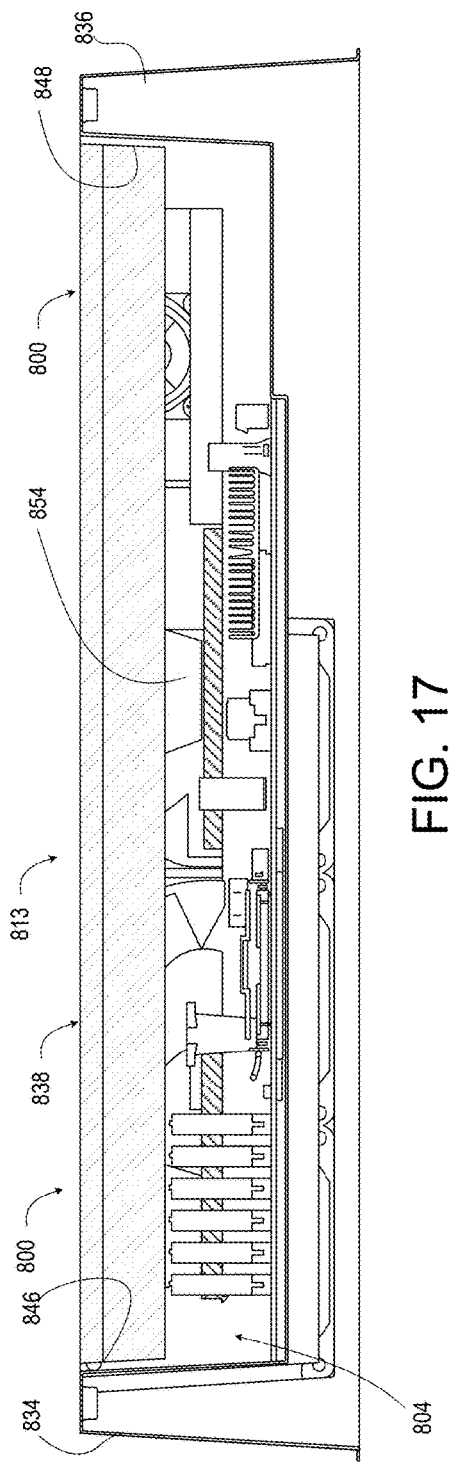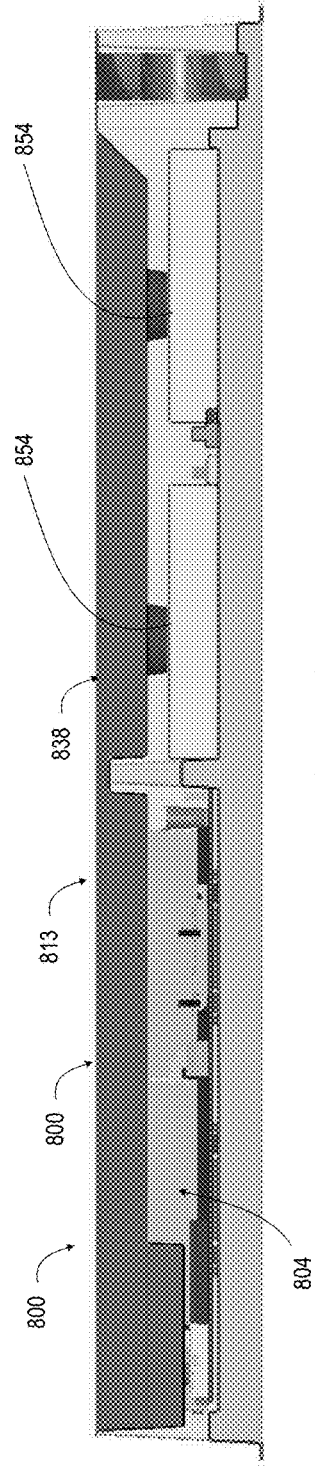

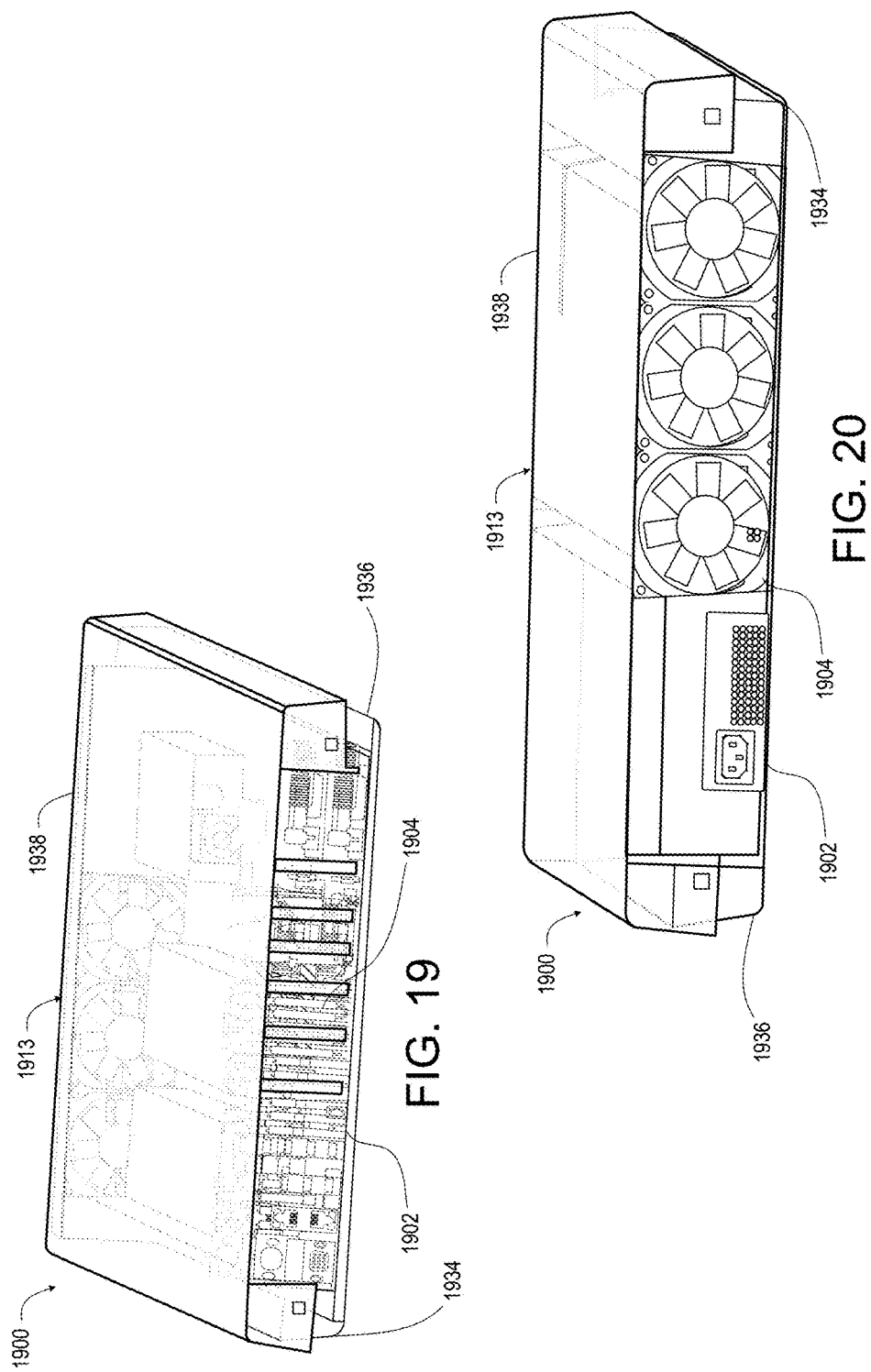

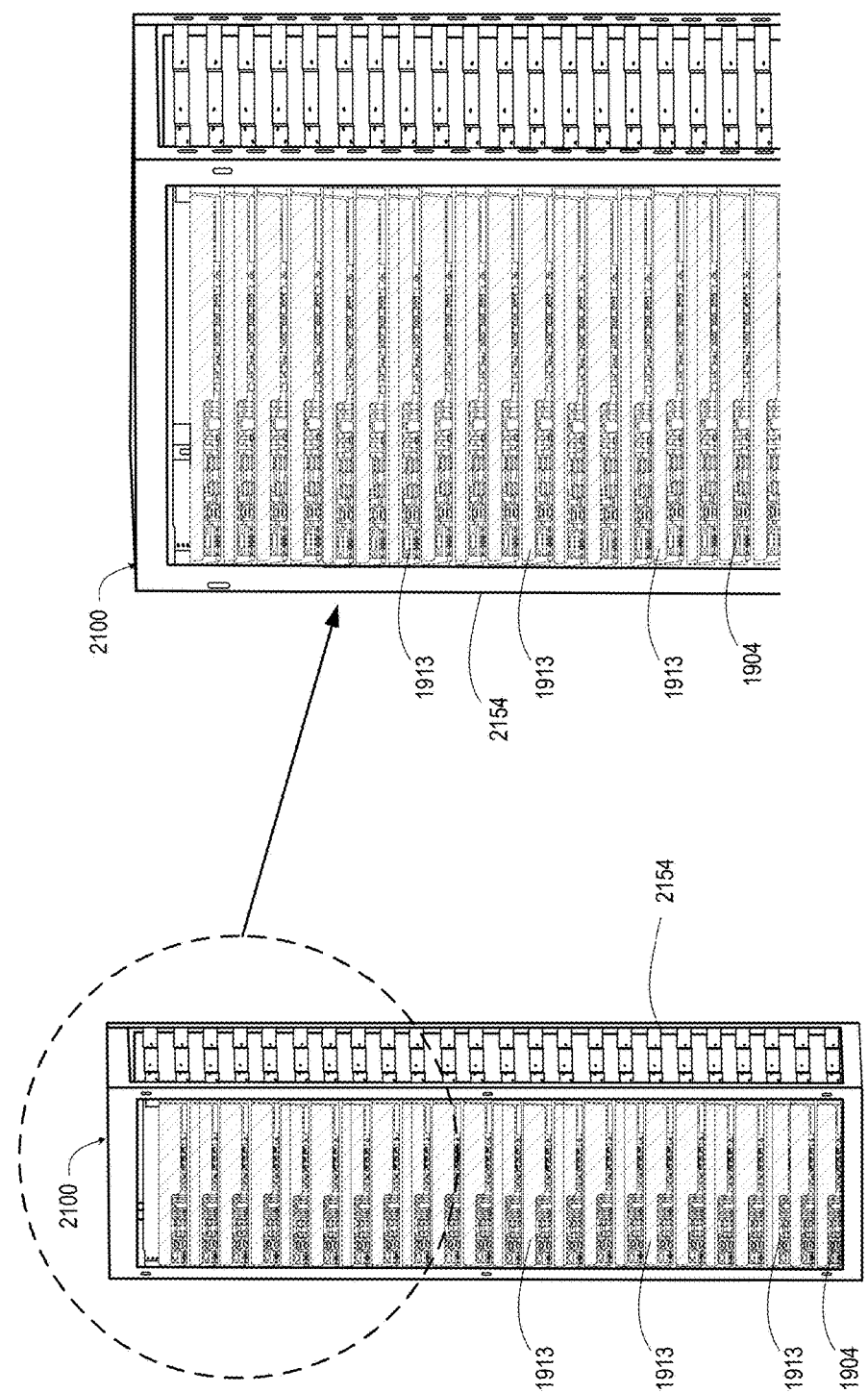

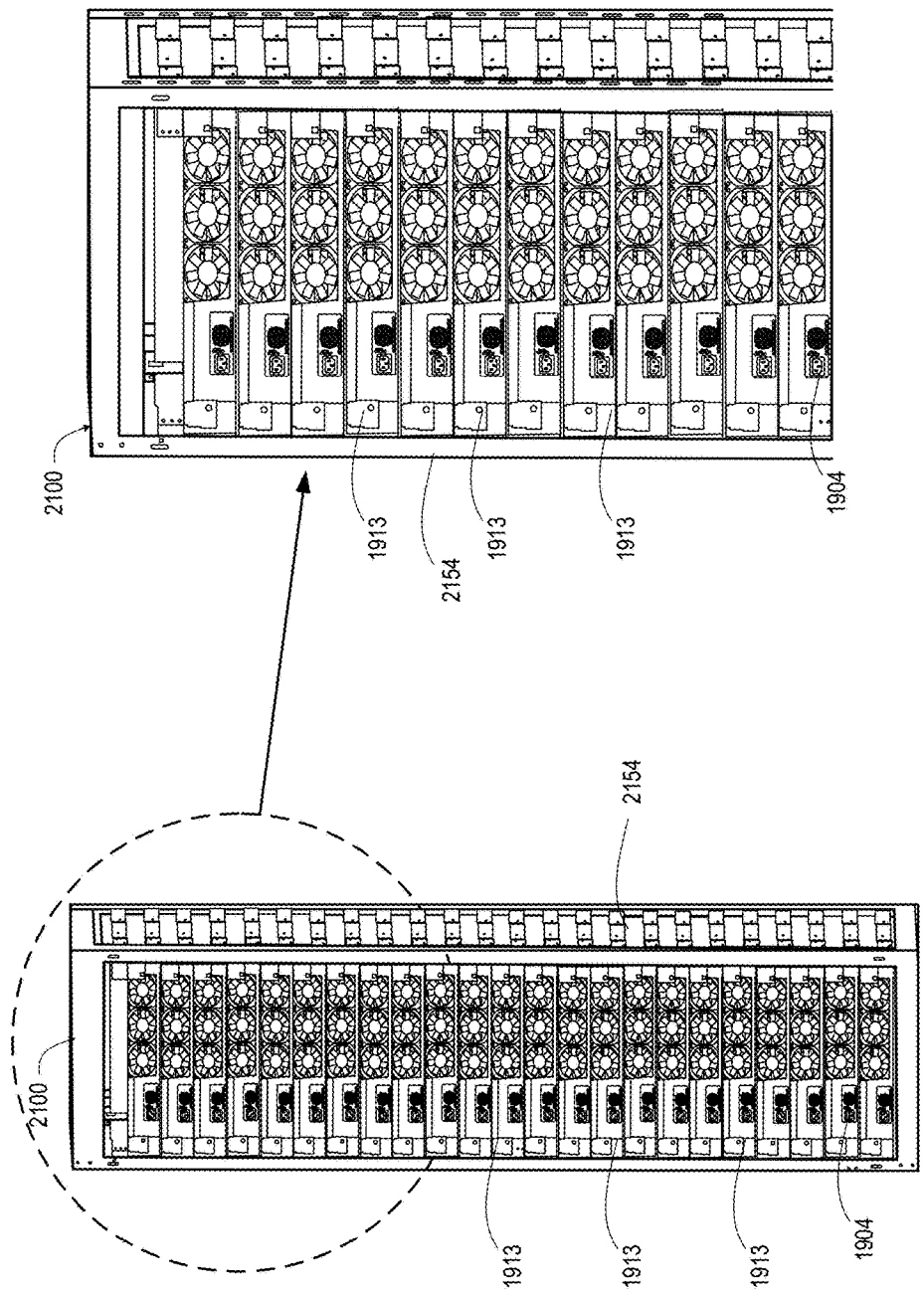

LIGHTWEIGHT SERVER CHASSIS CONFIGURED FOR MODULAR INSERTION OF CUSTOMER SELECTABLE COMPONENTS FOR DOWNSTREAM ASSEMBLY OF INFORMATION HANDLING SYSTEM AT CUSTOMER LOCATIONS

BACKGROUND

1. Technical Field

This disclosure generally relates to information handling systems (IHS), and more particular to a modularly-assembled IHS and a chassis supporting modular assembly of compute components to configure an IHS.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

An original equipment manufacturer (OEM) of IHSes often assembles an IHS such as an individual server or a rack assembly of a number of rack servers. The OEM then ships the assembled individual server or the rack-assembled IHS to an end user destination. Often these IHSes are built to order. Numerous industry conditions can preclude assembling any particular configuration before an order is received from an end user. For example, the processor and other computer technology is rapidly evolving, the cost of certain compute components used in an IHS is subject to volatility, and customer requirements can have great variability. One implication of waiting for customer orders is that the utilization efficiency of the workforce at the OEM is subject to the vagaries in the amount of orders received.

Some end users are sophisticated in their understanding of IHSes and invest in a large number of IHSes for a data center facility. A large order can create a correspondingly large manufacturing delay at the OEM. However, the end user may have the space and personnel required to configure their IHSes onsite. Further, the end user may also have some motivation to select particular compute components to be used within the IHS. In addition, similar considerations can be applicable after deployment of the IHS, particularly for continued servicing and upgrading of the IHSes. The end user may prefer to order chasses and compute components that can be economically and quickly shipped.

BRIEF SUMMARY

The illustrative embodiments of the present disclosure provide an information handling system (IHS) with a lightweight server (LWS) chassis having a surface that includes a plurality of slots formed within the chassis surface. Each slot is sized to receive a specific compute component of a plurality of different compute components that when inserted within the slots and interconnected on the chassis collectively provide a fully functional IHS. An end user can select a chassis and specific compute components that can be inserted into the chassis in order to configure an IHS. The assembly and/or configuration of the IHS can thus be completed at the end user location after the chassis and selected compute components have been shipped to the end user location from the original equipment manufacturer (OEM) or supplier of the LWS chassis and compute components.

According to at least one aspect of the present disclosure, a method is provided for provisioning an IHS to an end user location. In one embodiment, the method includes providing a lightweight server (LWS) chassis having a surface that includes a plurality of slots formed within the chassis surface. Each slot is sized to receive a specific compute component of a plurality of different compute components that collectively provide a fully functional IHS when the components are (i) inserted into the chassis, (ii) communicatively interconnected in the chassis via required communication and power cabling, and (iii) provided with required power to operate. The compute components are themselves configured to fit within one or more of the slots in the surface of the LWS chassis. According to at least one aspect, the compute components are packaged in protective wrapping that provides specific thermal and EMI qualities that are required when the compute component is inserted into and utilized within the executing IHS. Once the compute components are inserted within their respective slots on the chassis, the method includes interconnecting various of the compute components to communicate with each other and providing the required power thereto for the IHS to operate.

According to at least one aspect of the present disclosure, an IHS is provided with more than one type of compute component. The IHS is further provided with a LWS chassis having a surface that includes a plurality of slots formed within the chassis surface and each sized to receive a respective one of the more than one type of compute component of a plurality of different compute components that collectively provide a fully functional IHS.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 8 illustrates an isometric view of another example LWS chassis having lateral sides and including molded receptacles formed in pliable material, according to one embodiment;

FIG. 17 illustrates a front side view cutaway along lines A-A of FIG. 14, according to one embodiment;

FIG. 18 illustrates a right side view cutaway along lines B-B of FIG. 15, according to one embodiment;

FIG. 19 illustrates a front isometric view of an additional example rack server having a LWS chassis, according to one embodiment;

FIG. 20 illustrates a rear isometric view of the additional example rack server having a LWS chassis of FIG. 19, according to one embodiment;

FIG. 21 illustrates a front side view of rack servers of FIG. 13 mounted in a rack, according to one embodiment;

FIG. 22 illustrates a detail front side view of the IHS of FIG. 21, according to one embodiment;

FIG. 23 illustrates a rear side view of the IHS of FIG. 21, according to one embodiment;

FIG. 24 illustrates a detail rear side view of the IHS of FIG. 23, according to one embodiment;

DETAILED DESCRIPTION

Figure 1:
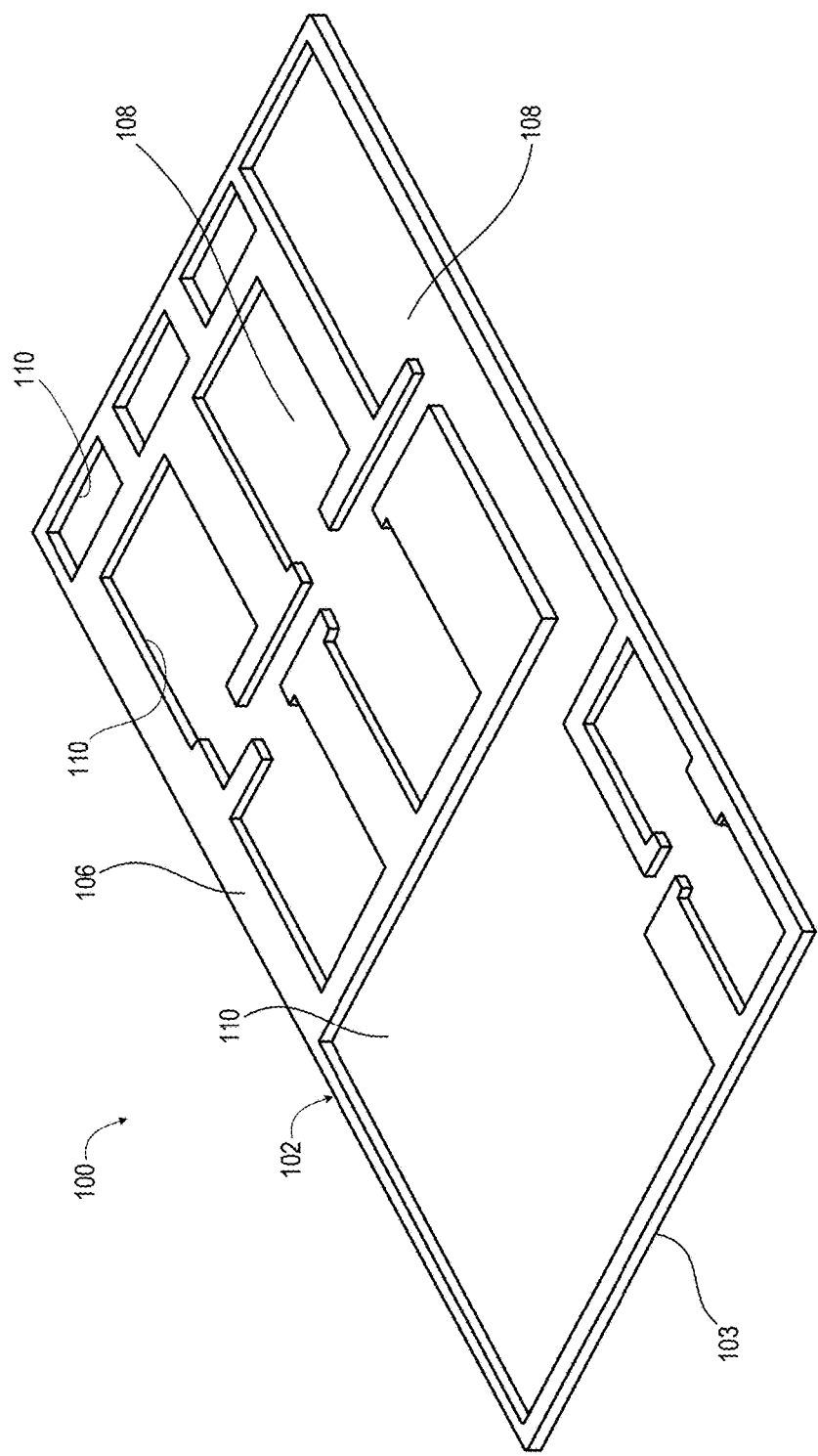
FIG. 1 illustrates an isometric view of an example lightweight server (LWS) chassis within which various aspects of the disclosure can be implemented, according to one or more embodiments.

The present disclosure provides an information handling system (IHS) having a lightweight server (LWS) chassis that is configured for modular insertion of customer selectable components for downstream assembly of the IHS at customer locations. The chassis is made of a lightweight material and is configured with receiving slots in which different functional compute components of an IHS can be fitted (or snapped in) and held in place. In one embodiment, the chassis can be shipped to the customer separately from the actual processing components. The end customer can select which chassis and which components are desired for the server product being configured. Parts can be shipped as separate components in packaging material that serves as the casing for each component part. In one or more embodiments, components are interconnected within the LWS chassis using standard cabling.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 2:
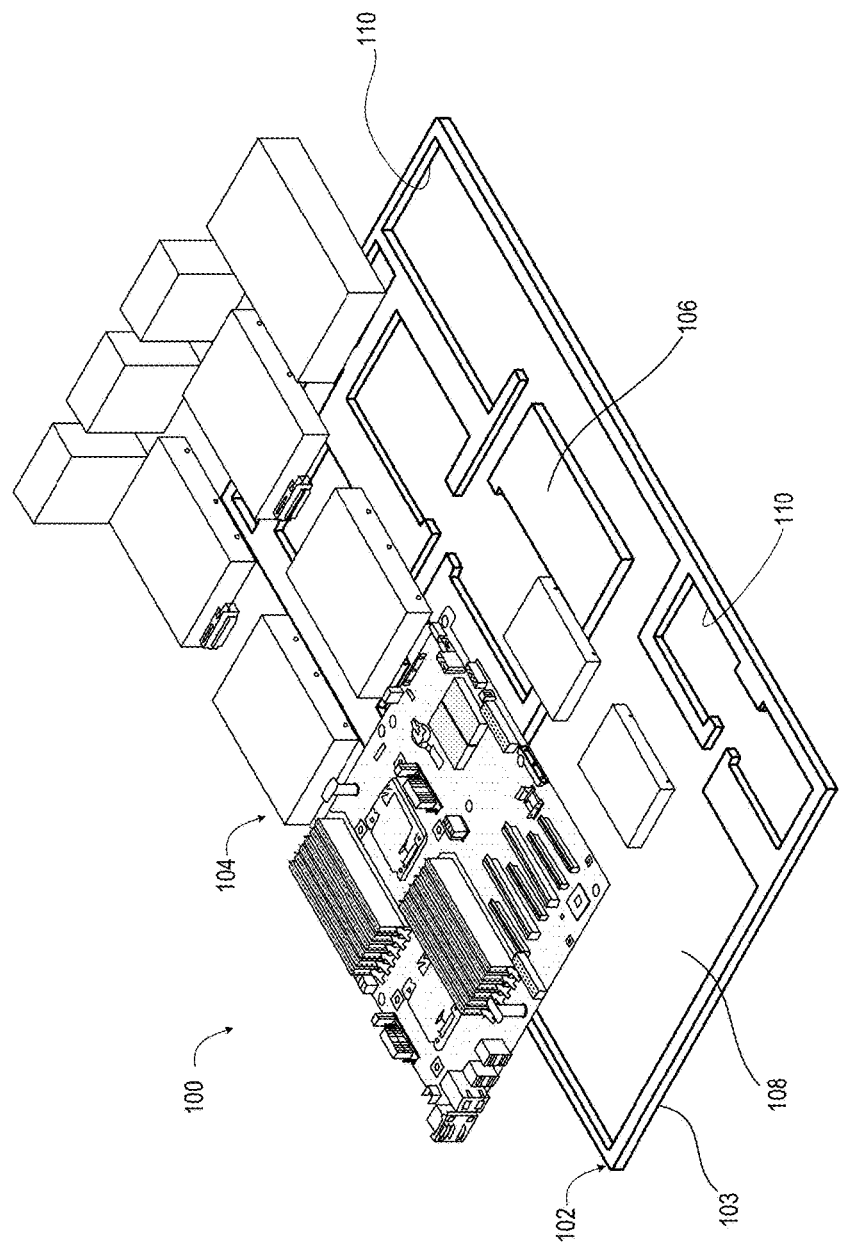
FIG. 2 illustrates an isometric view of the LWS chassis of FIG. 1 with an exploded view of modular, functional compute components, according to one embodiment.
Figure 3:
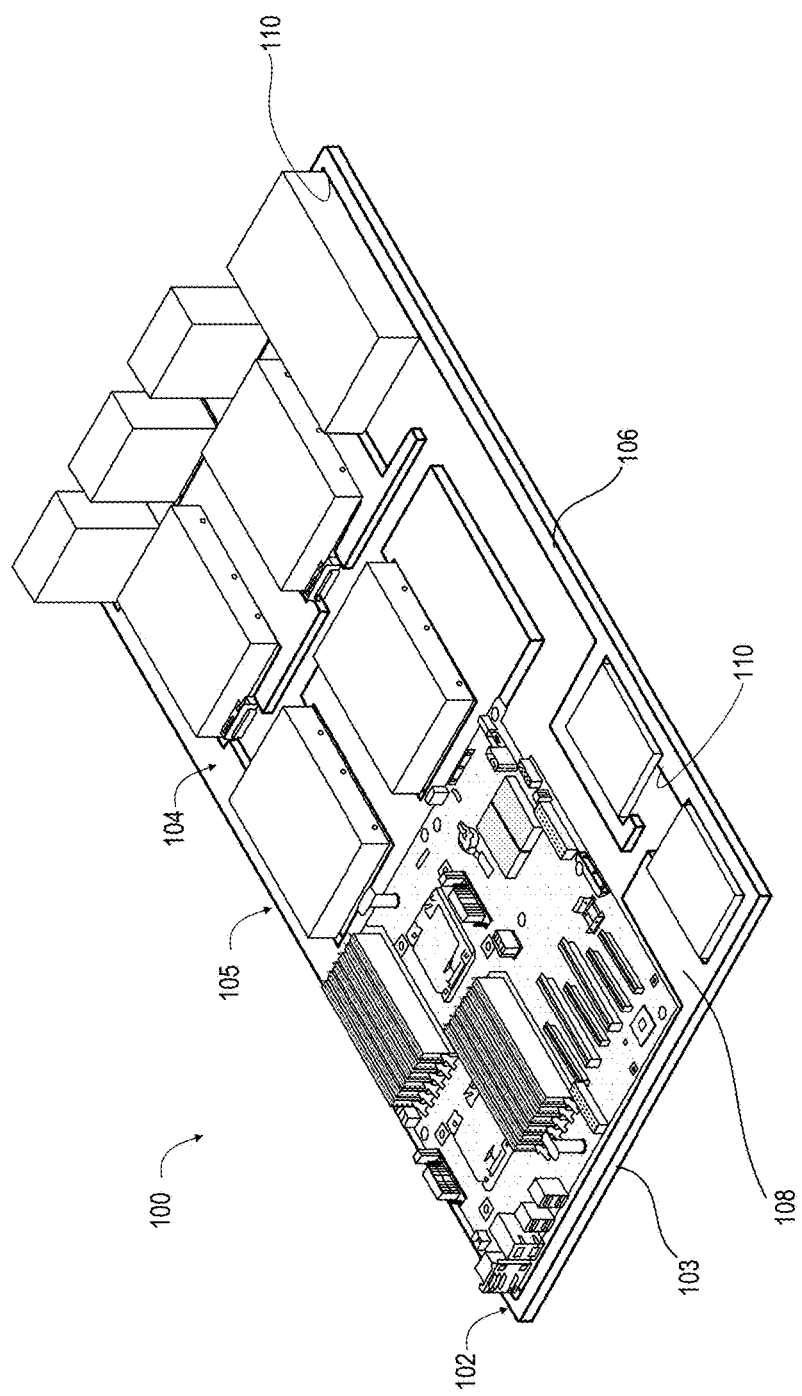
FIG. 3 illustrates an isometric view of the modular, functional compute components engageably received by the LWS chassis of FIG. 2, according to one embodiment.

FIGS. 1-3 illustrate at least a portion of an IHS 100 that includes LWS chassis 102 that receives modular, functional compute components 104 (FIGS. 2-3). FIG. 1 illustrates an example LWS chassis 102 within which various aspects of the disclosure can be implemented, according to one or more embodiments. FIG. 2 illustrates the LWS chassis 102 with the modular, functional compute components 104 disassembled from the LWS chassis 102. FIG. 3 illustrates the modular, functional compute components 104 engageably received by the LWS chassis 102. The LWS chassis 102 provides structural rigidity to maintain shape during shipping and during functional use after shipping. For example, the material incorporated into the LWS chassis 102 can withstand static weight loads, expected moisture exposure, expected temperature range exposure, expected vibration and impact loads, etc.

The LWS chassis 102 can provide the structural support for these compute components 104 during both shipping of the IHS 100 and usage at a final destination as a fully assembled IHS chassis 105 (FIG. 3). In one embodiment, the LWS chassis 102 include a base panel 103 that has a top surface 106 that includes slots 108 formed therein that are each sized to receive a specific compute component 104 of a plurality of different compute components 104 that collectively provide a fully functional IHS 100. Examples of configurable compute components 104 that can be part of the IHS 100 include, but are not limited to, redundant and non-redundant power supply units, solid state data storage, optical disk data storage, tape drive, hard disk drives, a motherboard optionally configured with modules such as a second processor, fan cooling, networking controllers, expansion boards, and user interface modules. In a particular embodiment, the LWS chassis 102 is formed of pliable materials into which are molded receptacles 110. The molded receptacles 110 define engageable surfaces of the slots 108 presented on the top surface 106 thereof. In one embodiment, the molded receptacles 110 are sized to selectively receive more than one type of compute component 104, thereby providing configurability at either the original equipment manufacturer (OEM) or at a final end customer or end destination at which the IHS 100 is assembled and/or utilized.

The pliable material, for example, can comprise a thermoplastic or an epoxy resin. Textile fabric or a biodegradable matrix can be embedded into the pliable material to create a biodegradable material. In one embodiment, the pliable material itself can be biodegradable such as a cellulose-based product that can be molded and cured into a structurally rigid shape.

In one embodiment, the LWS chassis 102 can be formed of material that is biodegradable for facilitating disposal at the end of life of the corresponding IHS 100. In one embodiment, the LWS chassis 102 can incorporate or be selectively coated with material that is flame retardant and heat resistant to mitigate hazards from compute components that can reach high temperatures. In one embodiment, the LWS chassis 102 incorporates shielding material for shielding a user from electromagnetic interference (EMI) generated by the modular, functional compute components and shielding the modular functional compute components 104 from electrostatic damage.

When the compute components 104 are operationally connected, such as by standard cabling, the compute components 104 can perform as at least a portion of the IHS 100, and the IHS 100 can be configured as a fully assembled IHS chassis 105 (FIG. 3). According to various embodiments, an IHS 100 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an IHS 100 may be a handheld device, personal computer, a server, a network storage device, or any other suitable device and may vary in size, shape, performance, functionality, and price. The IHS 100 may include random access memory (RAM), one or more processing resources such as a central processing unit (CPU) or hardware or software control logic, read only memory (ROM), and/or other types of nonvolatile memory. Additional components of the IHS 100 may include one or more disk drives, one or more network ports for communicating with external devices as well as various input and output (I/O) devices, such as a keyboard, a mouse, and a video display. The IHS 100 may also include one or more buses operable to transmit communications between the various hardware components.

FIGS. 4A, 4B, 5, 6, 7A, and 7B illustrate that the IHS 100 can further include a casing 114 that is laterally sized to closely receive the LWS chassis 102 (FIG. 1). In one embodiment, the casing 114 has properties to serve as packaging material for shipping without needing additional impact-resistant or void fill material. The casing 114 can also serve a dual purpose as providing support to the LWS chassis 102 at an end user destination. For example, the casing 114 can perform a dual role of providing protection to at least a portion of the IHS 100 after shipping when the IHS 100 is in functional operation.

Figure 4A:
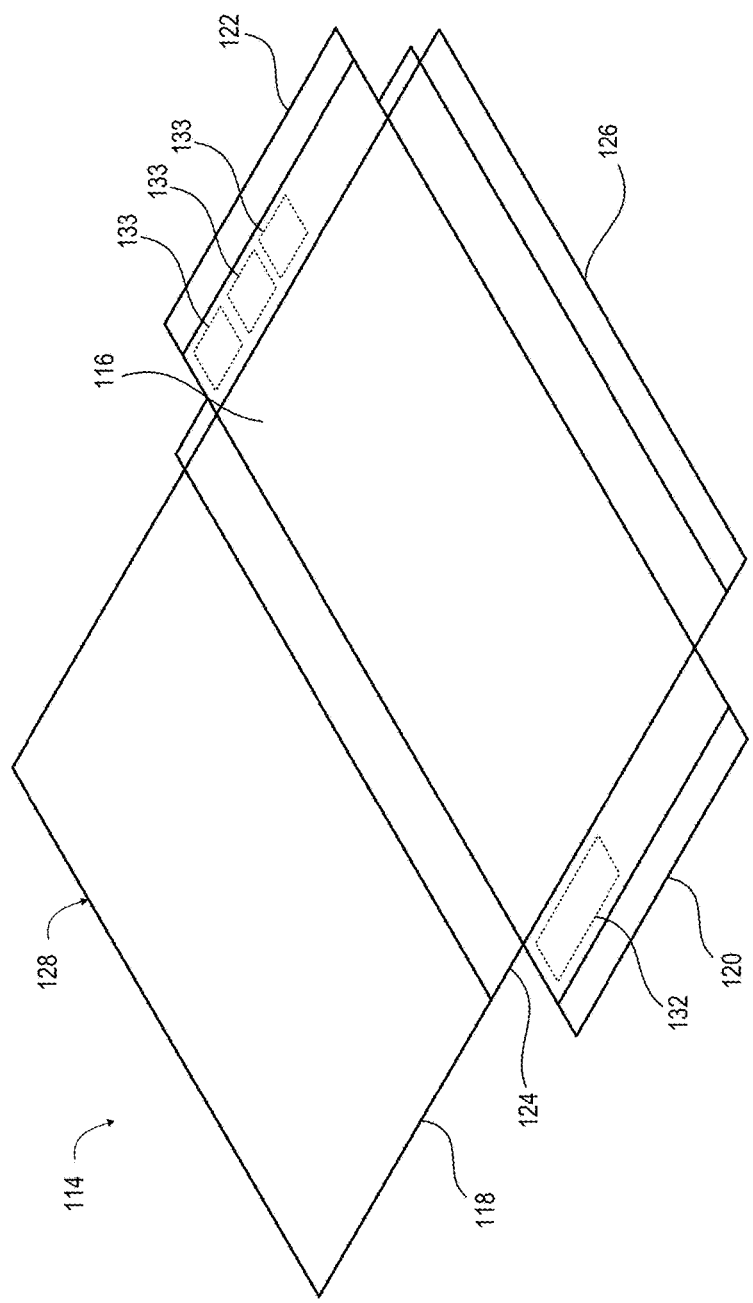
FIG. 4A illustrates an isometric view of a net of an unassembled casing formed of an impact absorbent material, according to one embodiment.
Figure 7A:
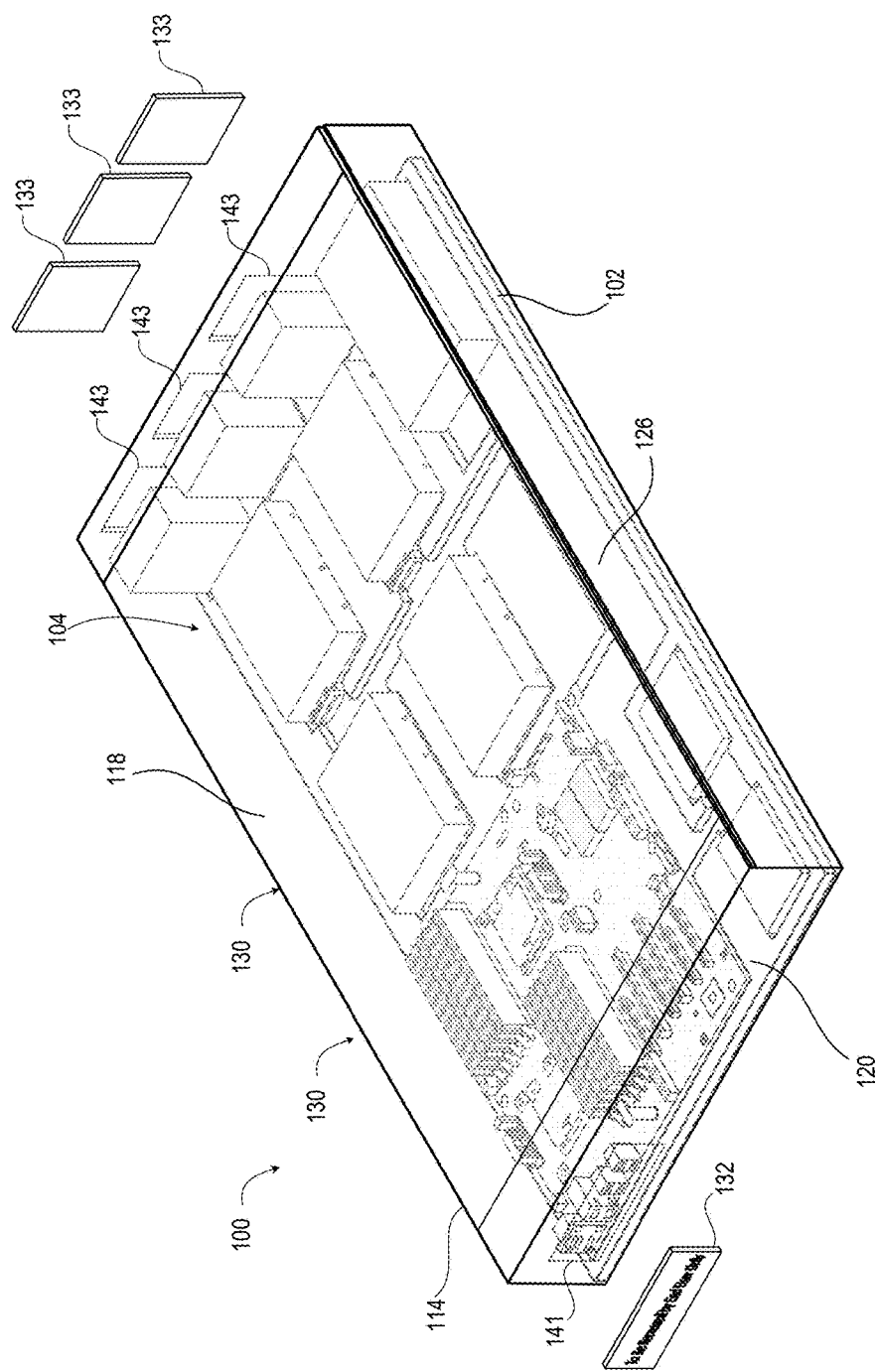
FIG. 7A illustrates an isometric view of a fully assembled casing that includes a removable portions and that protects the inserted LWS chassis and compute components, according to one embodiment.
Figure 7B:
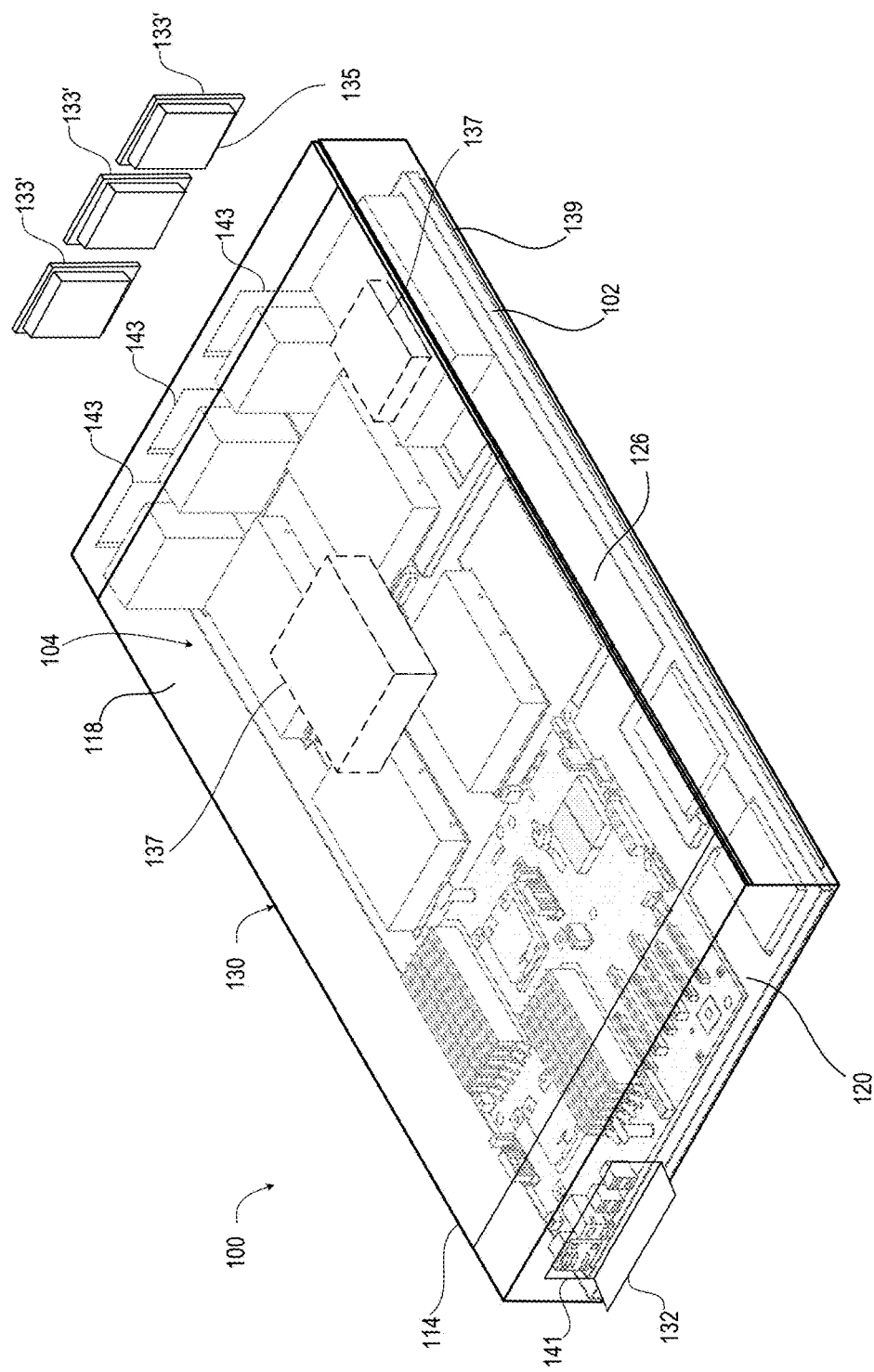
FIG. 7B illustrates an isometric view of a fully assembled casing that includes removable portions and impact absorbent materials and that protects the inserted LWS chassis and compute components, according to one embodiment.

With particular reference to FIG. 4A, in one embodiment the casing 114 includes a base segment 116, a top segment 118, a front segment 120, a back segment 122 and a pair of left and right lateral sides 124, 126 interconnected in a net 128 which forms a cuboid shape 130 (FIGS. 7A-7B). The casing 114 can be formed from cardboard stock having structural rigidity as well as being impact absorbent material. Prior to sealing the casing 114, one lateral side 124 connects the base segment 116 to the top segment 118. Front segment 120, back segment 122 and one lateral side 126 are initially unattached flaps that can be folded towards each other and/or interconnected to complete the box casing.

Each of the segments 116, 118, 120, 122 and lateral sides 124, 126 can formed of an impact absorbent material.

In one embodiment, the casing 114 can be formed from impact absorbent components such as a corrugated laminate. The casing 114 can incorporate biodegradable material such as a cellulose product. The casing 114 can be formed from stock material such as the corrugated laminate that is cut into a net 128. The net 128 can facilitate opening up portions for air flow and access, such as by unsealing the front segment 120 and the back segment 122 that are formed as flaps. The casing 114 can further include removable portions 132, 133 that can provide protection during shipment and then be removed after shipping. For example, the removable portions 132, 133 can be formed by perforating the casing 114 or the removable portions 132, 134 can be attached by a releasable adhesive. The front removable portion 132 can be aligned and engage with communication and power connectors that are subsequently inserted into the casing. The rear removable portions 133 can be aligned with exhaust paths from cooling fans that may be inserted into one or more slots or locations within the casing 114.

Figure 4B:
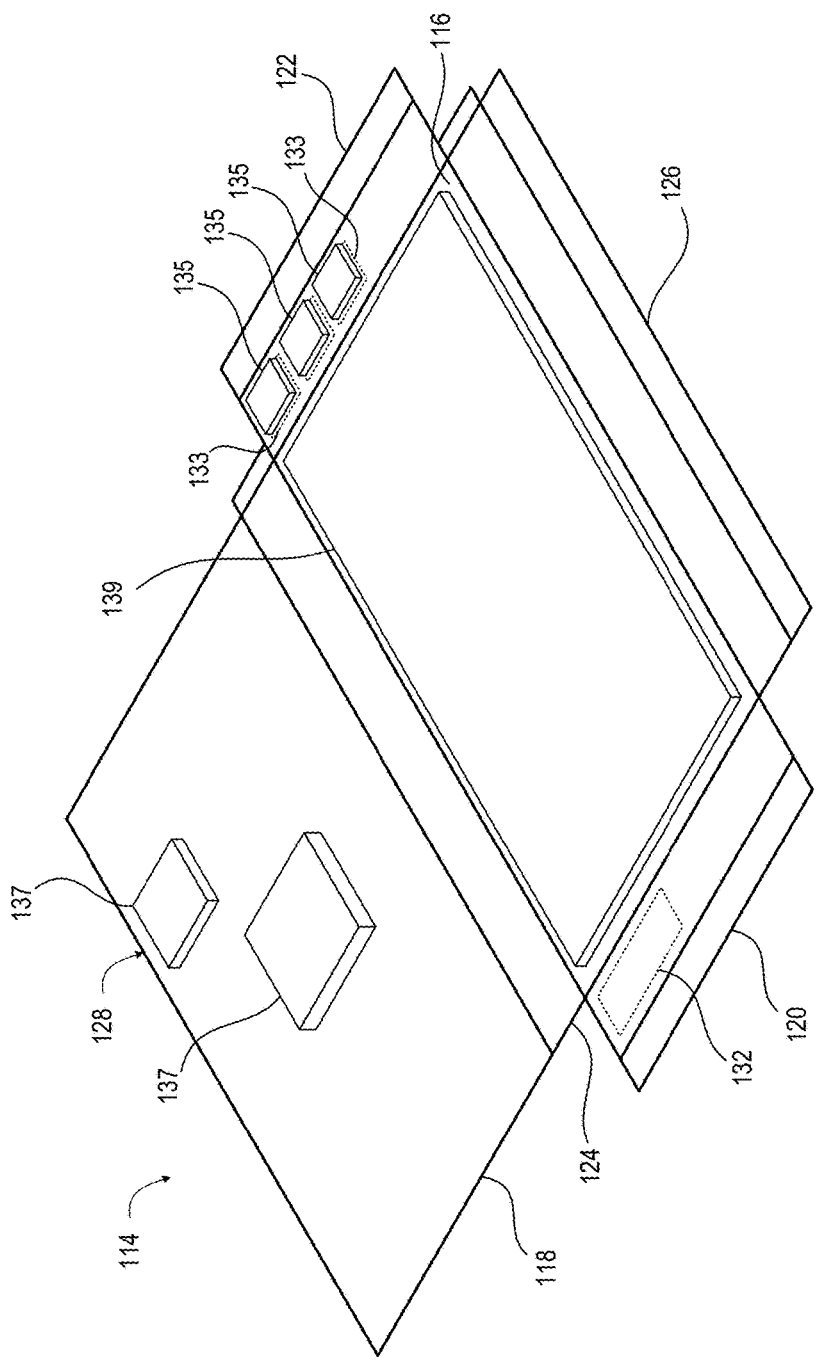
FIG. 4B illustrates an isometric view of a net of an unassembled casing formed of an impact absorbent material and including additional impact absorbent material, according to one embodiment.

In an embodiment illustrated by FIG. 4B, the casing 114 is augmented with additional impact absorbent material pads 135, 137, 139 that are attached to an interior surface. For example, each of the additional impact absorbent material pads 135, 137, 139 can serve as void fill to firmly hold in place compute components that are received in the casing 114. Examples of impact absorbent materials can include a polyurethane foam, nonwoven synthetic fabric, cardstock formed into a rectoid shape, etc.

In one embodiment, the surface of bottom pad 139 can be tacky or adhesive coated to hold the LWS chassis 102 in place. Similar adhesive contact can be provided between the LWS chassis 102 and/or the compute components 104 and one or more other sides of the casing 114. For example, the casing 114 can be sealed around the LWS chassis 102 after placement. As another example, the LWS chassis 102 with compute components 104 can be sufficiently small to enable insertion into one open side of the casing 114 after the casing 114 is formed into a rectoid with at least one side open.

Figure 5:
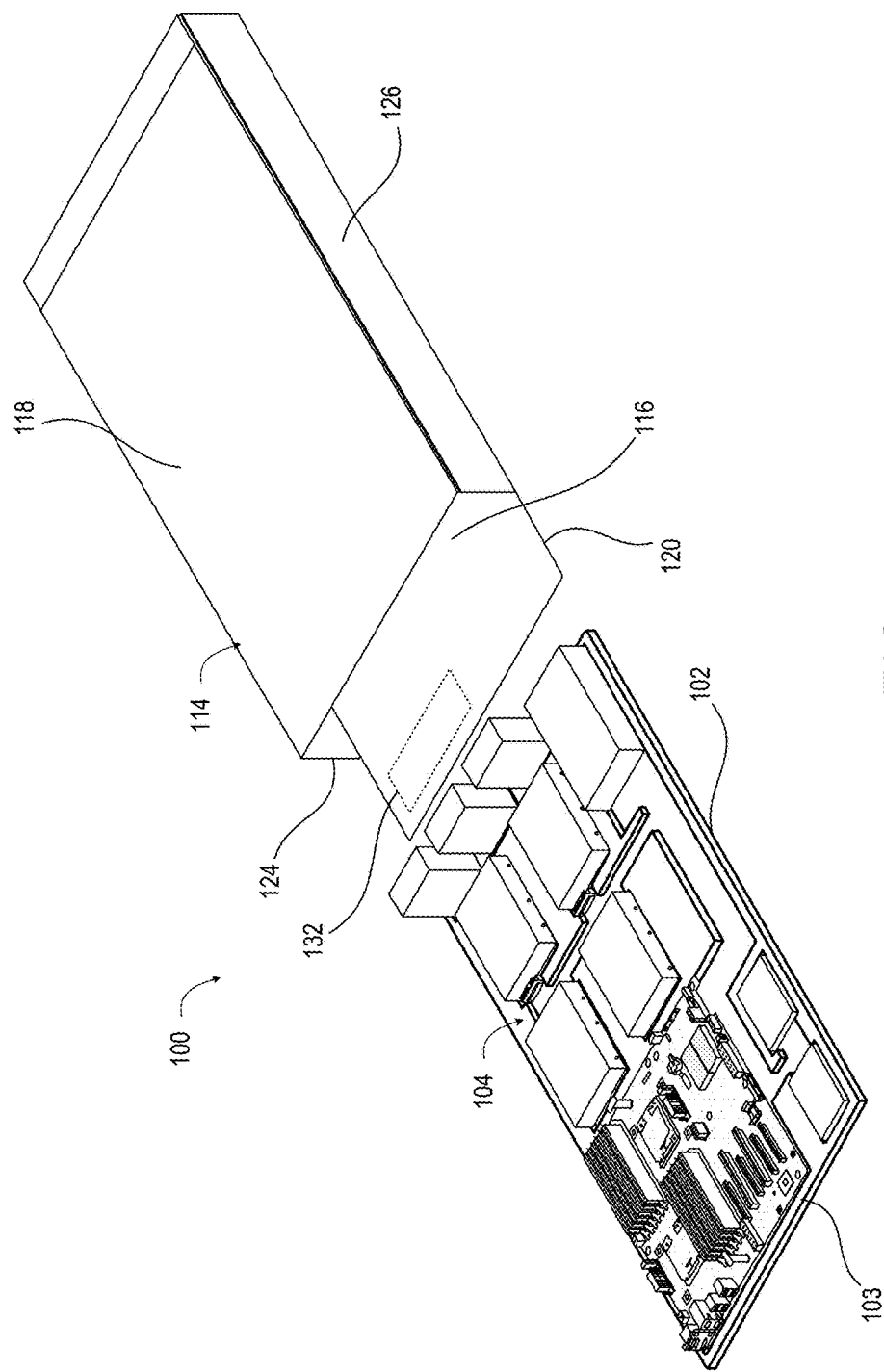
FIG. 5 illustrates an isometric view of the assembled compute components and LWS chassis of FIG. 3 and a partially assembled casing of FIG. 4, according to one embodiment.
Figure 6:
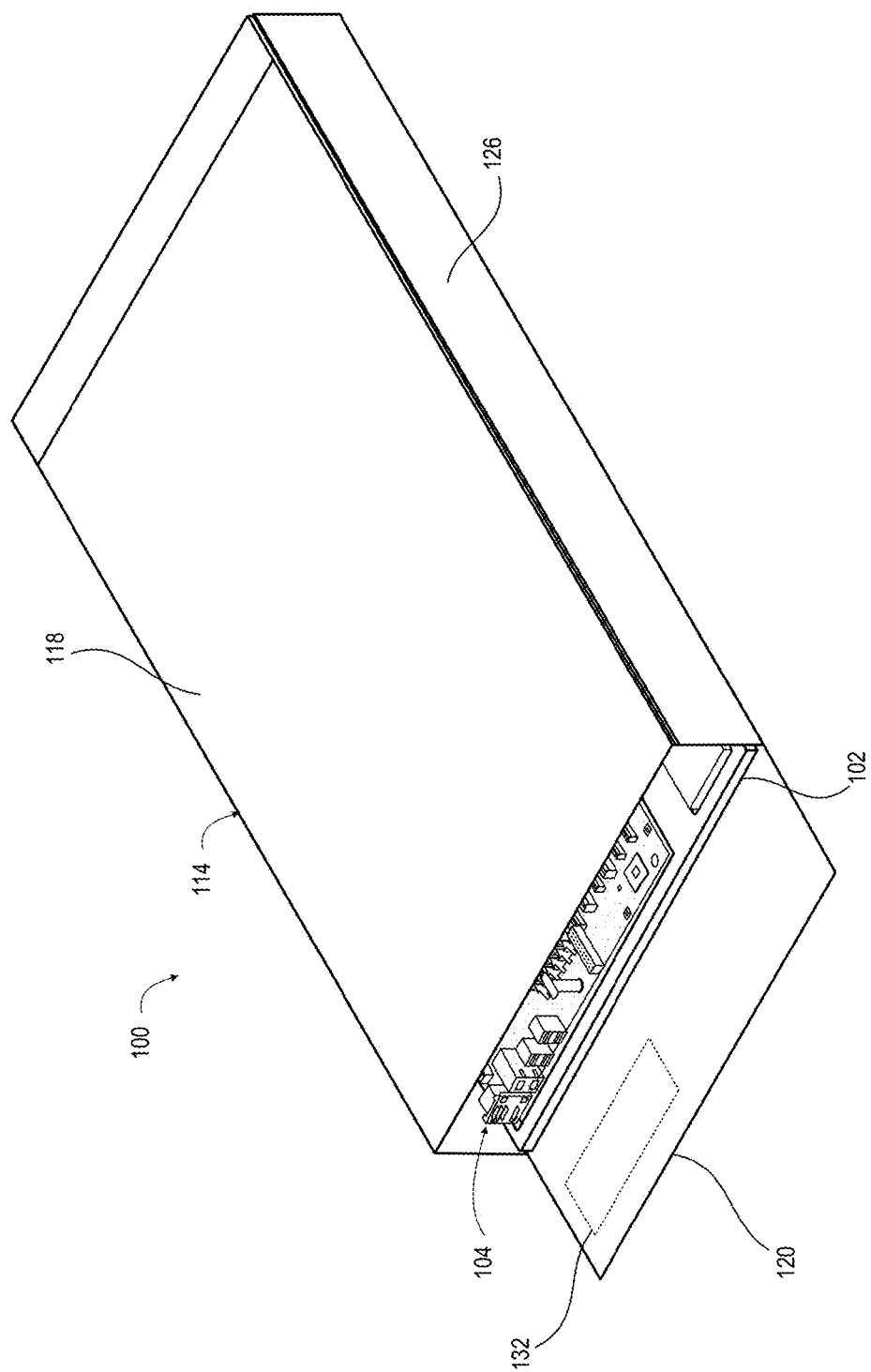
FIG. 6 illustrates an isometric view of the assembled compute components and LWS chassis inserted into an unsealed end of the partially assembled casing of FIG. 5, according to one embodiment.

FIG. 5 illustrates the LWS chassis 102 with the assembled compute components 104. The casing 114 is partially assembled, with the front segment 120 remaining unsealed to allow insertion of the server chassis. FIG. 6 illustrates the LWS chassis 102 with assembled compute components 104 inserted into an unsealed end of the partially assembled casing 114. FIG. 7A illustrates a fully assembled casing 114 that includes removable portion 132. Casing 114 protects the inserted LWS chassis 102 and compute components 104. During shipping, the casing 114 can fully encompass the chassis 102 and inserted compute components 104. The casing 114 can provide impact absorbent material that protects the chassis 102 and compute components 104 during shipping. Removable portion 132 of the casing 114 can be an entire surface or a partial surface, depending on the specific implementation. In one embodiment, the removable portions 132, 133 are defined by one or more perforated segments that can be removed. After the encased IHS 100 has been shipped to the end user destination, the removable portions 132, 133 can be removed to respectively leave apertures 141, 143 that enable exterior access to one or more modular, functional compute components located on the server chassis. For example, the removable portion 132 can provide an access point for power cabling or communication cabling. As another example, the removable portions 132, 133 can provide apertures for required air flow to enter or exit the casing for thermal management of the compute components 104. In one embodiment, FIG. 7B illustrates the casing 114 that has been augmented with the additional impact absorbent material pads 135, 137, 139. In one embodiment, the top pads 137 can be sized and placed to allow air flow through the casing 114. Thus the top pads 137 can serve as void fill and as impact absorbent material during shipping and remain in place after shipping.

In one embodiment, the casing 114 and/or chassis 102 can be formed of material that is biodegradable for facilitating disposal at end of life of the encased IHS 100. In one embodiment, the casing 114 and/or chassis 102 can incorporate or can be selectively coated with material that is flame retardant and heat resistant to mitigate hazards from compute components 104 that can reach high temperatures. In one embodiment, the casing 114 and/or chassis 102 incorporates shielding material for shielding a user from electromagnetic interference (EMI) generated by the modular, functional compute components 104 and shielding the modular functional compute components 104 from electrostatic damage.

Figure 9:
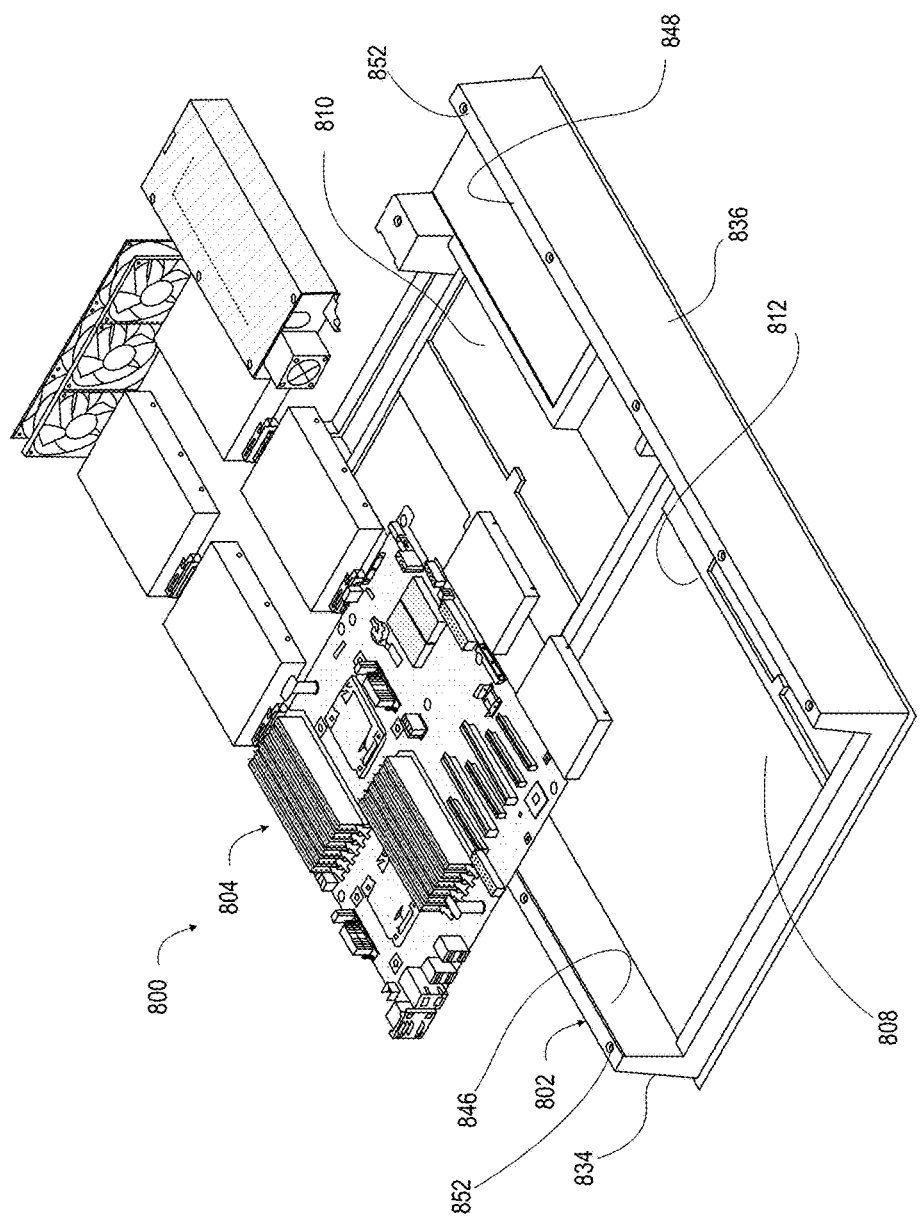
FIG. 9 illustrates an isometric view of the LWS chassis of FIG. 8 with an exploded view of modular, functional compute components, according to one embodiment.
Figure 10:
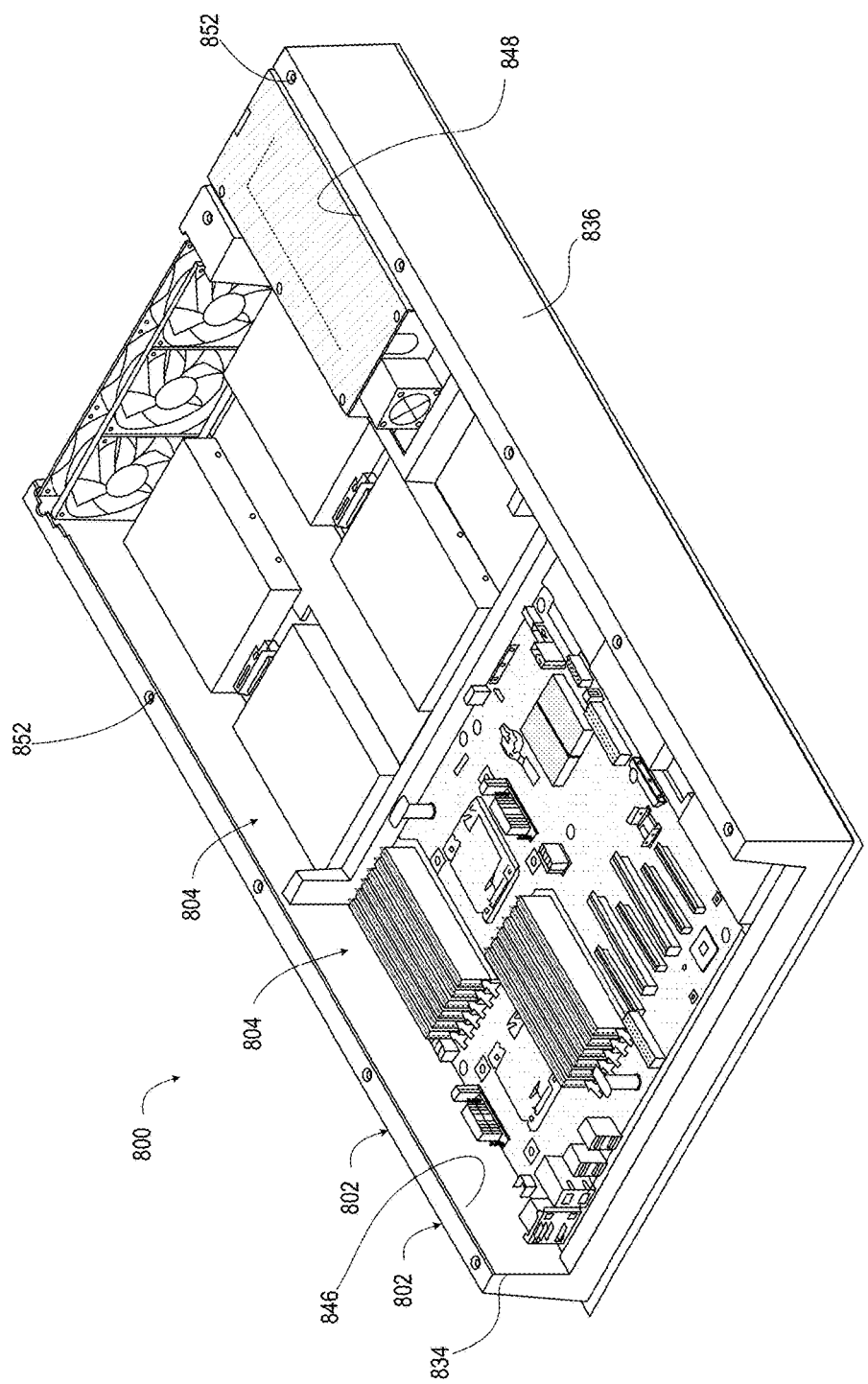
FIG. 10 illustrates an isometric view of the modular, functional compute components engageably received by the LWS chassis of FIG. 9, according to one embodiment.

FIGS. 8-18 illustrate a portion of an IHS 800 that includes another example lightweight rack server chassis 802 that receives modular, functional compute components 804 (FIGS. 8-10). The LWS chassis 802 provides the structural support for these compute components 804 during both shipping of the IHS 800 and utilization at a final end customer/destination. In one embodiment, the LWS chassis 802 has a top surface 808 that includes slots 810 formed therein that are each sized to receive a specific compute component 804 of a plurality of different compute components 804 that when interconnected, collectively provide a fully functional IHS 800. In a particular embodiment, the LWS chassis 802 is formed of a pliable material into which are molded receptacles 812 that define engageable surfaces of the slots 810 presented on the top surface 808 thereof. In one embodiment, the molded receptacles 812 are sized to selectively receive more than one type of compute component 804, thereby providing configurability at either the original equipment manufacturer (OEM) or at a final customer location. For example, a number of different solid-state storage devices can require an identical molded receptacle 812 allowing an end user to select a desired amount of storage. Power supplies of different power ratings can require an identical molded receptacle 812 enabling an end user to upgrade for the power requirements of the other compute components. Some interchangeable compute components 804 can be of different media types, such as data storage as optical drives, hard disk drives, tape backups, and solid state drives can require an identical molded receptacle 812 for allowing an end user to select a technology suitable for the application.

With particular reference to FIG. 8, the LWS chassis 802 includes attached left and right lateral sides 834, 836. In FIG. 9, the LWS chassis 802 exposes the molded receptacles 812 to receive the compute components 804. FIG. 10 illustrates that the left and right lateral sides 834, 836 extend above all of the received compute components 804.

FIGS. 11-18 illustrate a chassis cover 838 utilized to complete the LWS chassis 802. The chassis cover 838 mates with the LWS chassis 802 to provide a complete enclosure for the compute components 804 and further protect the inserted computer components 804 during either shipping or during operation. In one embodiment, the chassis cover 838 (FIG. 12) includes left and right lateral flanged edges 840 to contact a top surface of the left and right lateral sides 834, 836 of the chassis 802. The chassis cover 838 also includes left and right recessed portions 842, 844 that are aligned respectively contact a respective inward surface 846, 848 of each lateral side 834, 836 of chassis 802. The interconnection between the LWS chassis 802 and the chassis cover 838 (FIG. 12) thereby provides for a lid enclosure that tends to stay in place. Affixing the chassis cover 838 to the LWS chassis 802 is also facilitated by recessed engagement features 850 in the former and a corresponding projecting engagement feature 852 (FIG. 12) in the latter.

The chassis cover 838 and the LWS chassis 802 can use other complementary geometric engagement features to guide placement. The chassis cover 838 can fit onto of the LWS chassis 802 in only one relative position laterally and longitudinally that is visually apparent to a customer. Locking features can also be provided.

Figure 11:
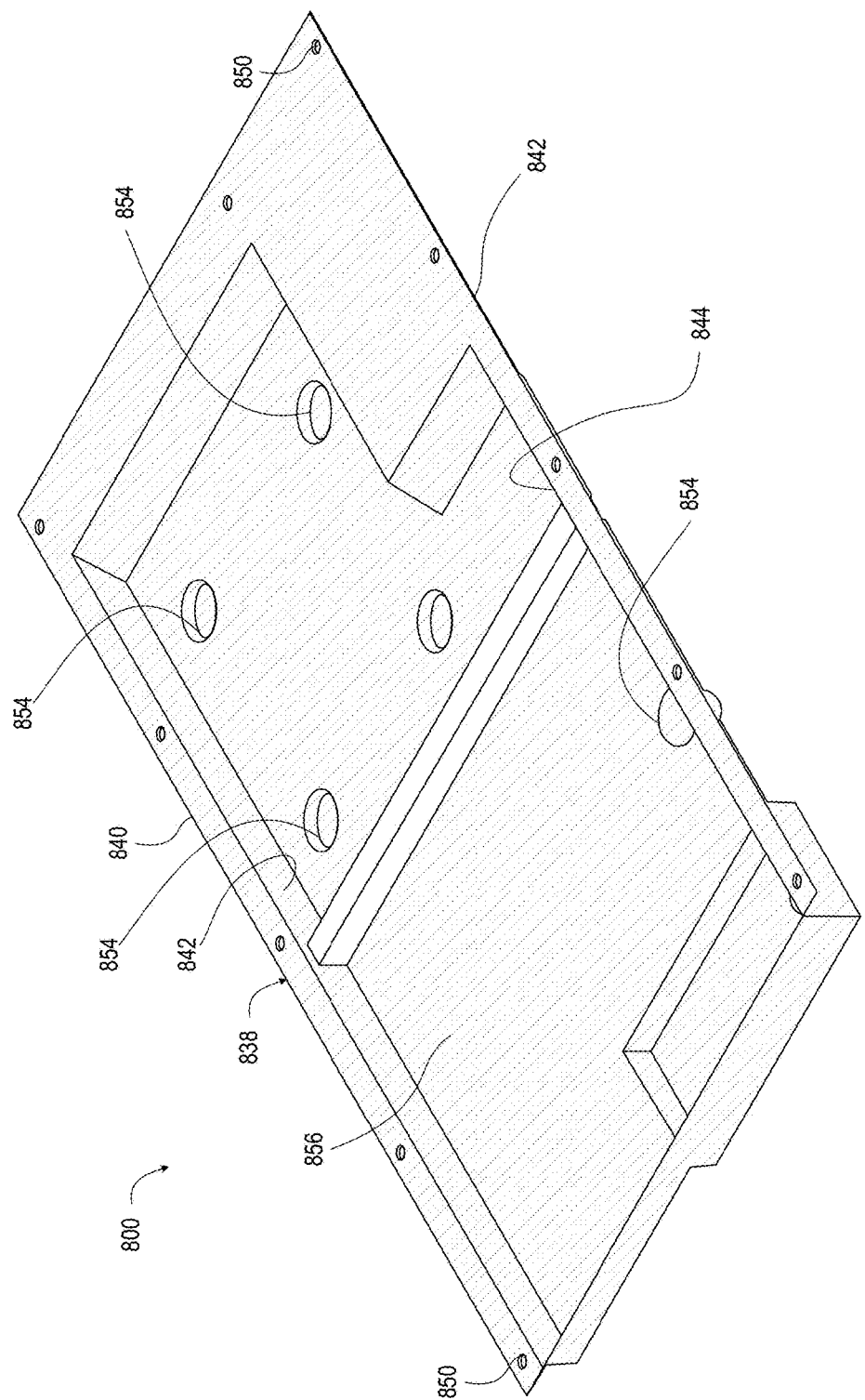
FIG. 11 illustrates an isometric view of a chassis cover for the LWS chassis of FIG. 8, according to one embodiment.
Figure 12:
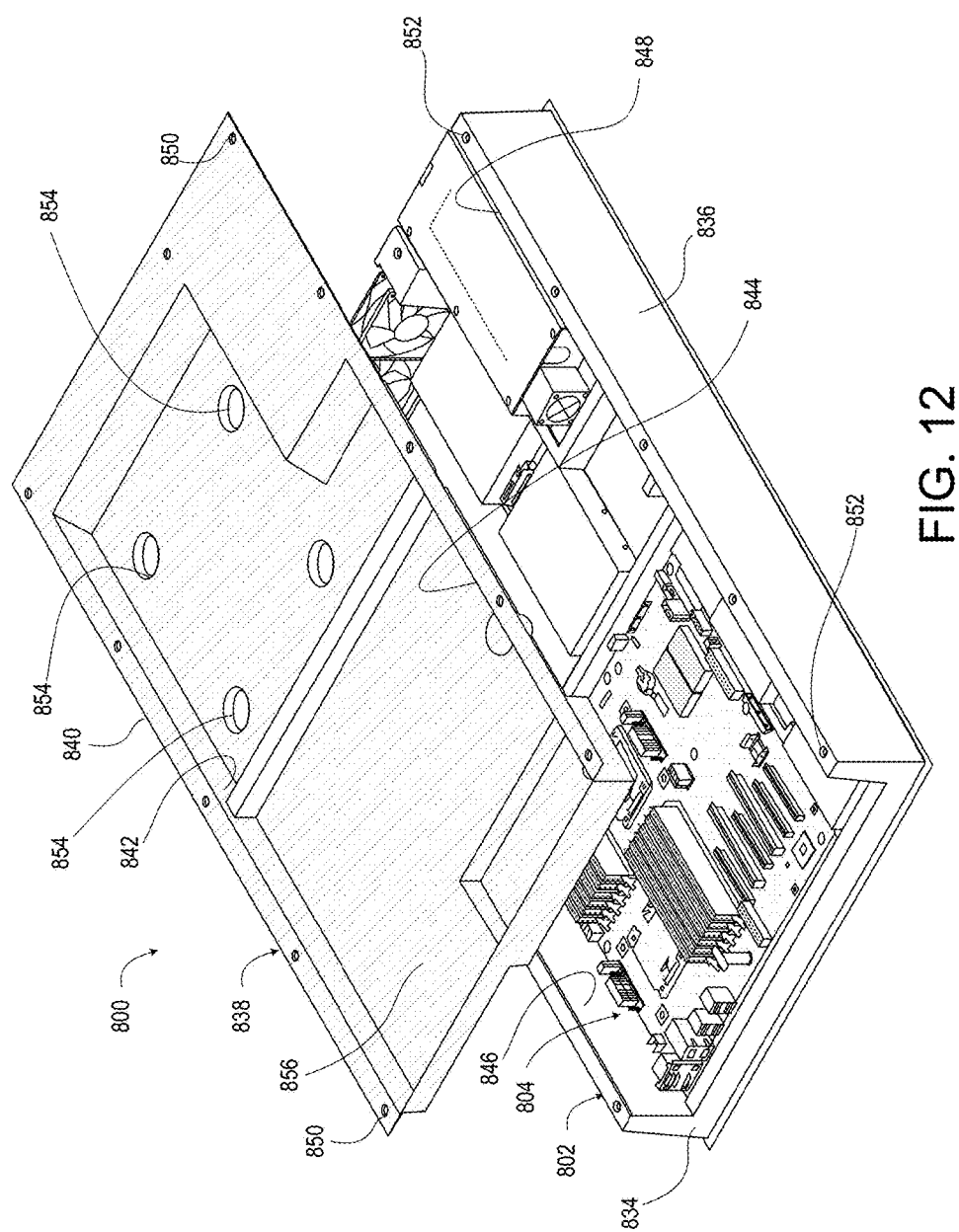
FIG. 12 illustrates an isometric view of the modular, functional compute components engageably received by the LWS chassis of FIG. 8 and an exploded view of the chassis cover of FIG. 11, according to one embodiment.
Figure 13:
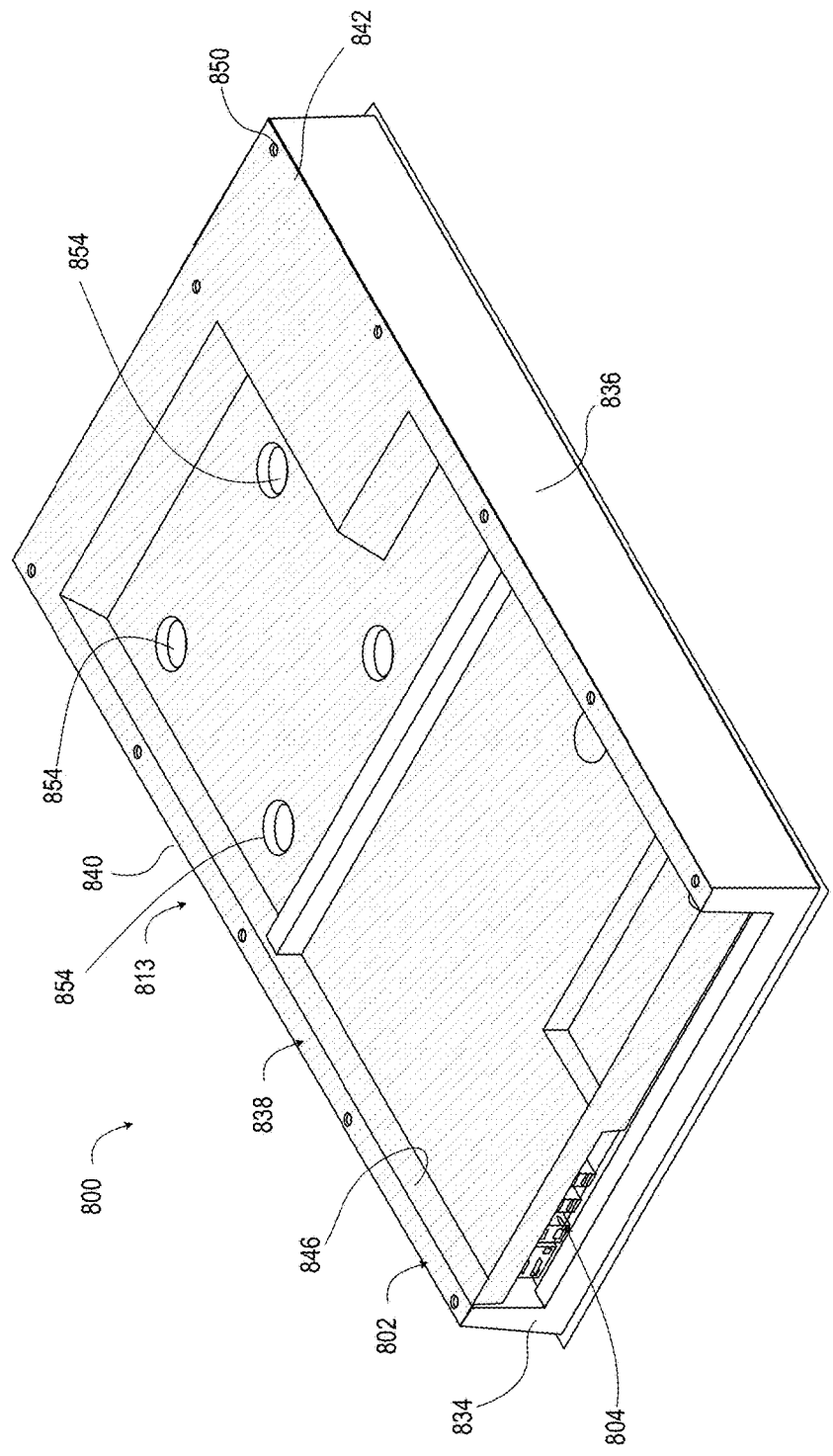
FIG. 13 illustrates an isometric view of the modular, functional compute components engageably received by the LWS chassis of FIG. 8 and enclosed by the chassis cover of the LWS chassis of FIG. 11, according to one embodiment.
Figure 14:
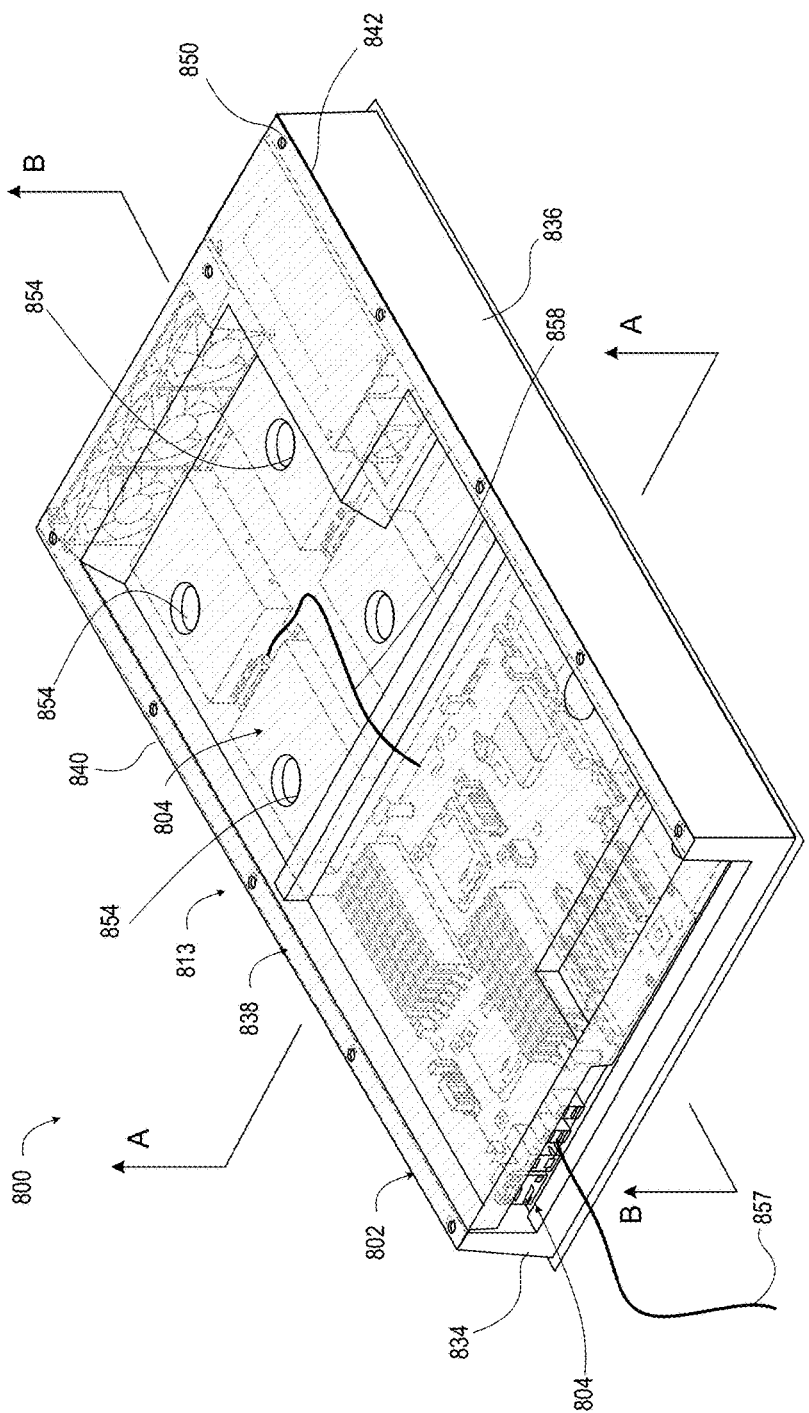
FIG. 14 illustrates an isometric view of a fully assembled IHS chassis of FIG. 13 with of the modular, functional compute components visible through the enclosed chassis cover, according to one embodiment.
Figure 15:
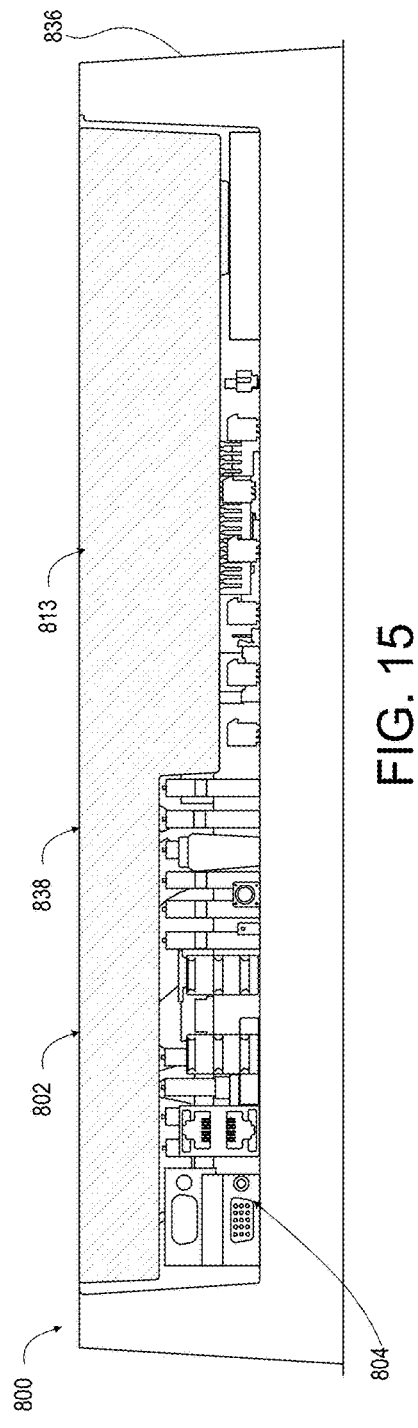
FIG. 15 illustrates a front side view of the rack server of FIG. 13, according to one embodiment.
Figure 16:
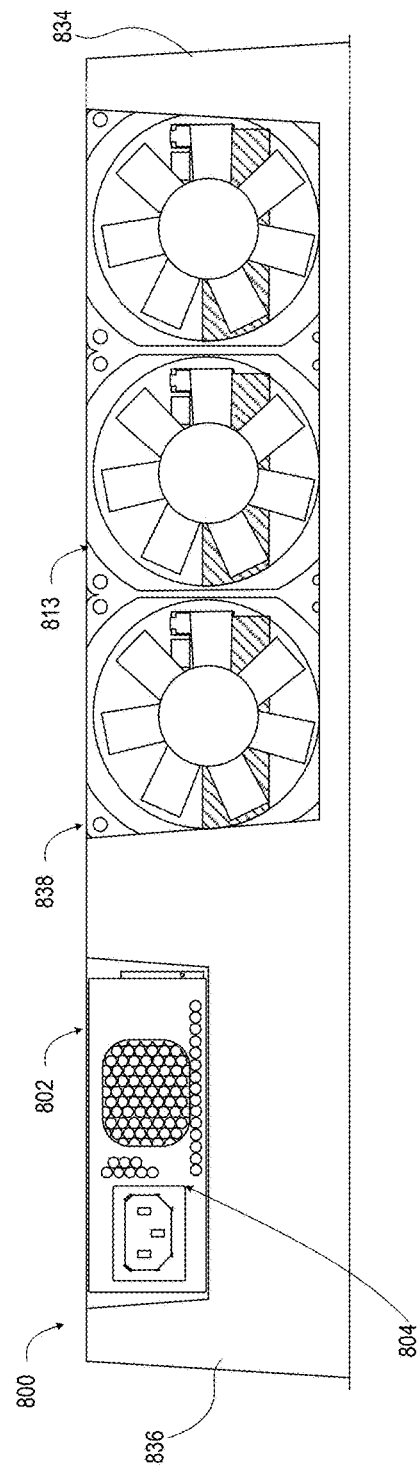
FIG. 16 illustrates a rear side view of the rack server of FIG. 13, according to one embodiment.

FIG. 11 illustrates the chassis cover 838 of the LWS chassis 802, according to one embodiment. FIG. 12 illustrates the modular, functional compute components 804 engageably received by the LWS chassis 802. In FIG. 12, the chassis cover 838 is illustrated as removed from the LWS chassis 802. FIG. 13 illustrates the modular, functional compute components 804 engageably received by the LWS chassis 802 and enclosed by the chassis cover 838 to form a rack server 813. Rack server 813 is capable of being utilized as one functional server component of a rack-based IHS 800, according to one embodiment. FIG. 14 illustrates an assembled rack server 813 which includes power cabling and communication cabling to enable rack server 813 to operate as at least a portion of rack-based IHS 800. FIG. 15 illustrates a front side view of the rack server 813, according to one embodiment. FIG. 16 illustrates a rear side view of the rack server 813, according to one embodiment.

In one or more embodiments, as illustrated by FIGS. 14 and 17-18, chassis cover 838 includes downward projections 854 to opposingly contact a selected inserted modular, functional compute component 804 and which serve as one or both of a void filler and for shock mounting. FIG. 17 illustrates a front side view cutaway along lines A-A of FIG. 14 to show the downward projections 854 FIG. 18 illustrates a right side view cutaway along lines B-B of FIG. 15 to also show the downward projections 854, according to one embodiment. According to one aspect of the disclosure, the chassis cover 838 is configured to also balance the area devoted to downward projections 854 with non-contacting portions to serve as an air flow baffle 856 which directs air flow across selected functional compute components 804 when inserted and/or operational within the server chassis 802. The air flow baffle 856 define a cross sectional area to affect a rate of air flow and physically guide air flow passing from front to back within the rack server 813. The air flow baffle 856 can be selectively sized to generate a particular air flow rate by compute components 804 that tend to generate more heat. The air flow baffle 856 can be formed by contouring an inner surface of the chassis cover 838 to direct air flow past a selected functional compute component within the LWS chassis 802. Interconnection cabling 858 can be connected to the compute components 804 to create a functional IHS 800. For clarity, only two connections are depicted, although it should be appreciated that numerous separate cables or cables integral to the LWS chassis 802 can be installed to provide the necessary power and communication connections for the compute components 804.

FIGS. 19-20 illustrate an example rack server 1913 for an IHS 1900 that has a LWS chassis 1902 containing compute components 1904 with a chassis cover 1938 laterally overlapping left and right lateral sides 1934, 1936 of the LWS chassis 1902. Specifically, FIG. 19 illustrates a front isometric view of the example rack server 1913 and FIG. 20 illustrates a rear isometric view of the example rack server 1913. In one embodiment, FIGS. 19-20 illustrate a stacking feature wherein lateral sides of each of the LWS chassis 1902 and the chassis cover 1938 flare outwardly. An OEM can ship a stack of LWS chasses 1902 or chassis covers 1938 in a nested stack to reduce shipping height.

FIGS. 21-24 illustrate an example IHS 2100 having a rack frame 2154 in which are mounted a plurality of the example rack servers 1913. In particular, FIG. 21 illustrates a front side view of an IHS 2100 comprised of rack servers 1913 mounted in a rack frame 2154. FIG. 22 illustrates a detail front side view of the IHS 2100 of FIG. 21. FIG. 23 illustrates a rear side view of the IHS 2100. FIG. 24 illustrates a detail rear side view of the IHS 2100. A customer can receive rack servers 1913 that contain compute components 1904 as assembled at the OEM and insert them in the rack frame 2154. The customer can also reconfigure compute components 1904 between individually received compute components 1904 or between different rack servers 1913. The LWS chassis 1902 and chassis cover 1938 readily disengage to expedite configuring or reconfiguring by the customer. Rather than imposing a labor and scheduling impact to the OEM, the customer can have an opportunity to insert customer selected compute components and to complete interconnections at the deployed destination in order to configure the functional IHS that meets customer requirements.

Figure 25:
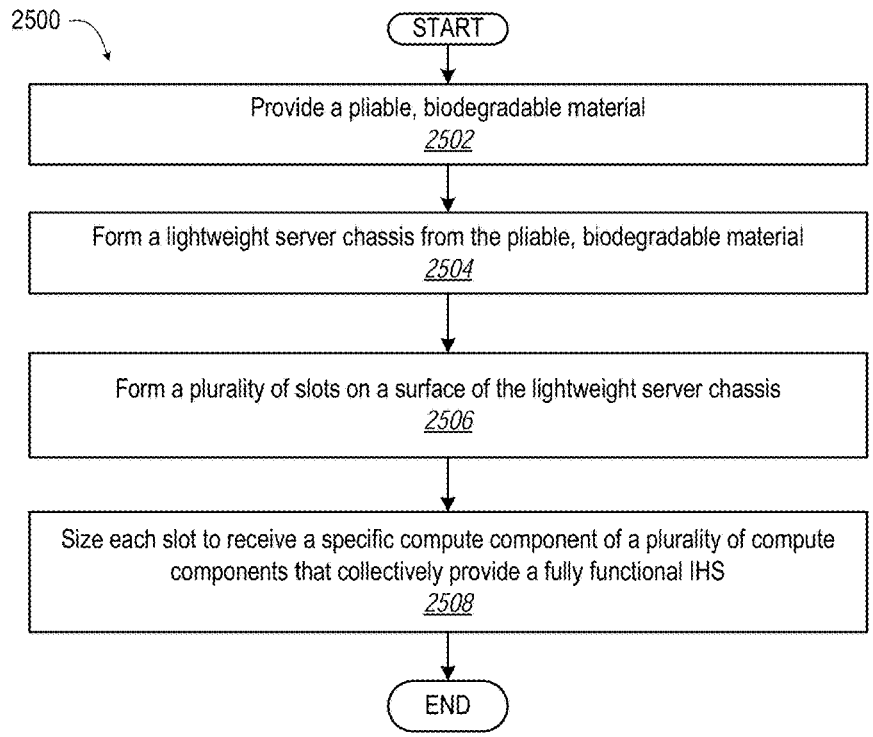
FIG. 25 illustrates a flow diagram of a method for provisioning, shipping and structurally supporting a functional IHS using a LWS chassis and dual function casing, according to one embodiment.

FIG. 25 illustrates a method 2500 of provisioning a LWS chassis 102 for modular insertion of customer selectable components for downstream assembly of the IHS 100 at customer locations. In the illustrative embodiment, the method 2500 includes providing a pliable, biodegradable material (block 2502). In block 2504, the method 2500 includes forming a LWS chassis 102 from the pliable, biodegradable material. The method 2500 includes forming a plurality of slots on a surface of the LWS chassis 102 (block 2506). The method 2500 includes forming each slot to receive a specific compute component of a plurality of compute components that collectively provide a fully functional IHS 100 (block 2508). In one embodiment, forming of the chassis and the slots can be performed during a single molding step. In one embodiment, forming of the slots can be performed in different steps. For example, the slots can be formed of a different material that is affixed to the surface. The surface can be thermally and/or electrically conductive for example whereas the slots can be thermally and/or electrically insulating.

Figure 26:
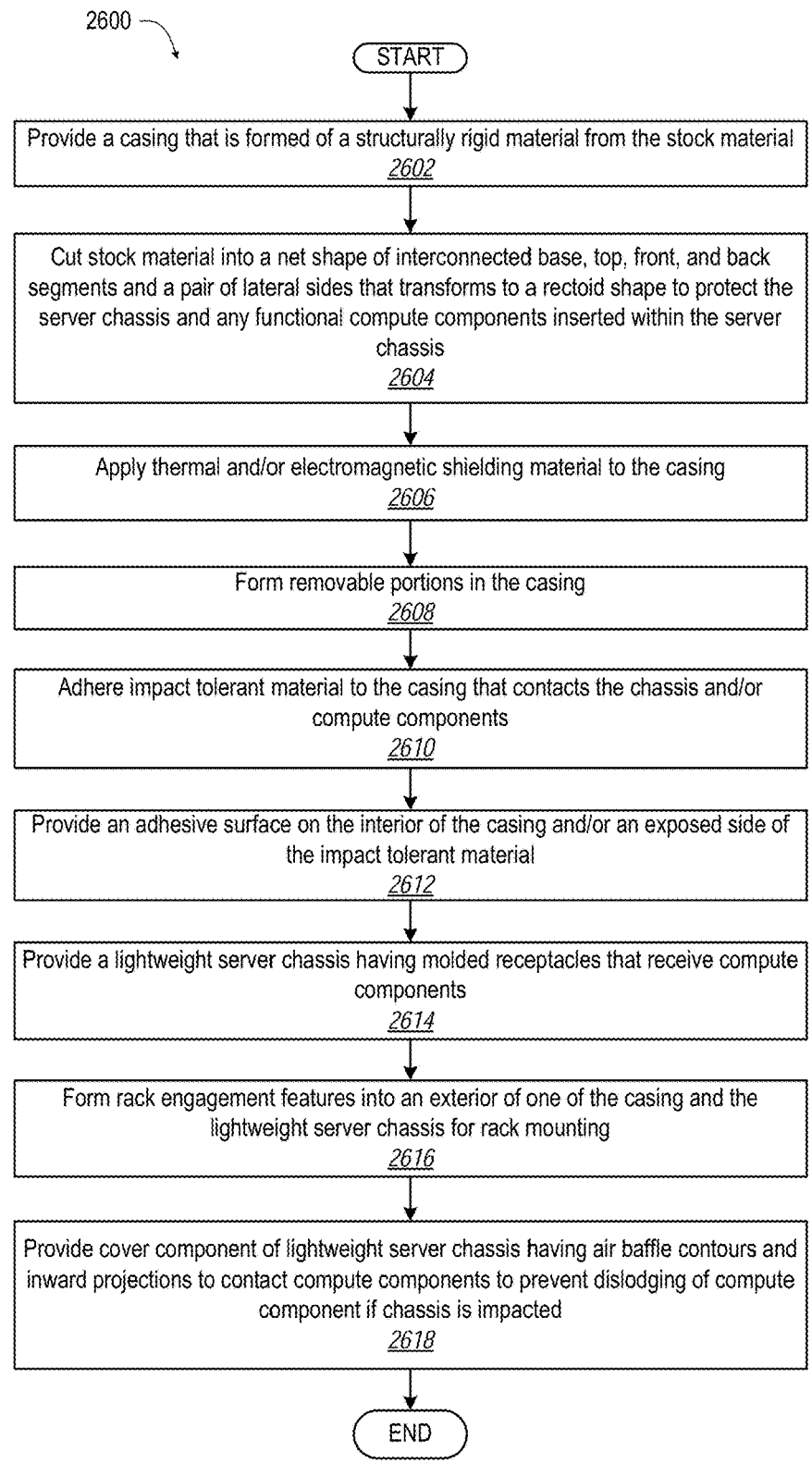
FIG. 26 illustrates a flow diagram of a method for providing a casing and chassis, according to one embodiment.

FIG. 26 illustrates an exemplary method 2600 for providing the casing 114 for LWS chassis 102 manufactured via method 2500 (FIG. 25). The method 2600 includes designing a casing 114 to be formed of a structurally rigid material from the stock material (block 2602). The stock material can be entirely or substantially biodegradable material. The stock material can also be inherently impact absorbent. The method 2600 includes obtaining the stock material and cutting the stock material into a net shape of interconnected base, top, front, and back segments and a pair of lateral sides that transforms into a rectoid shape (block 2604). The rectoid shape thus formed protects the server chassis and any functional compute components inserted within the server chassis. In an illustrative embodiment, method 2600 includes applying thermal and/or electromagnetic shielding material to the casing 114 (block 2606).

In one embodiment, the method 2600 includes providing a removable portion of the casing 114 that provides impact absorbent material during shipping (block 2608). In at least one embodiment, the removable portion further enables exterior access to one or more modular, functional compute components located on the chassis by removal of the removable portion after shipping. In one particular embodiment, the method 2600 includes providing the removable segments by forming perforated segments in the casing 114 that can be removed after shipping of the IHS. In an illustrative embodiment, the method 2600 further includes adhering impact absorbent materials to the casing 114 that contact the chassis and/or the compute components to serve purposes such as void fill (block 2610). In a particular embodiment, the method 2600 further includes providing an adhesive surface on the interior of the casing 114 and/or an exposed side of the impact absorbent material to maintain the contents of the casing 114 in position (block 2612).

With the casing 114 provided, the method 2600 can further include providing a LWS chassis 102 having molded receptacles that receive compute components (block 2614). In one embodiment, the method 2600 can further include forming, such as by adhering, rack engagement features into an exterior of one of the casing 114 and the LWS chassis 102 mounting (block 2616). These rack engagement features can be performed by the customer at the destination or during fabrication of one of the casing 114 and LWS chassis 102.

In some embodiments, the method 2600 can further include providing a chassis cover of the LWS chassis 102 that has air baffle contours to control air flow for cooling and that has inward projections to contact compute components to prevent dislodging of compute component if LWS chassis is impacted (block 2618). The contours can be integrally molded as part of the chassis cover or separate components affixed to an interior of the chassis cover.

One or more automated processes can produce at least a portion of casing. For example, cardboard stock can be impregnated, coated, or adhesively adhered to with material having thermal protective properties or electromagnetic shielding properties. To economically proportion such materials, only specific areas requiring such treatments can be targeted. The cardboard stock can be conveyed to a cutting die machine to automatically cut the cardboard stock into a net shape. Flaps of the net can be crimped at the ended fold point. Removal portions can be stamped out. Impact absorbent material in the form of pads or layers can be adhered to portions of the net shape. Similarly, one or more automated processes can produce a chassis. For example, a pliable material can be stamped or vacuum molded into a bottom and/or a cover shape. Examples of pliable material include a thermal polymer, epoxy resins, etc. Such materials can also be used to provide structural rigidity to a filler component such as textile fibers.

Figure 27:
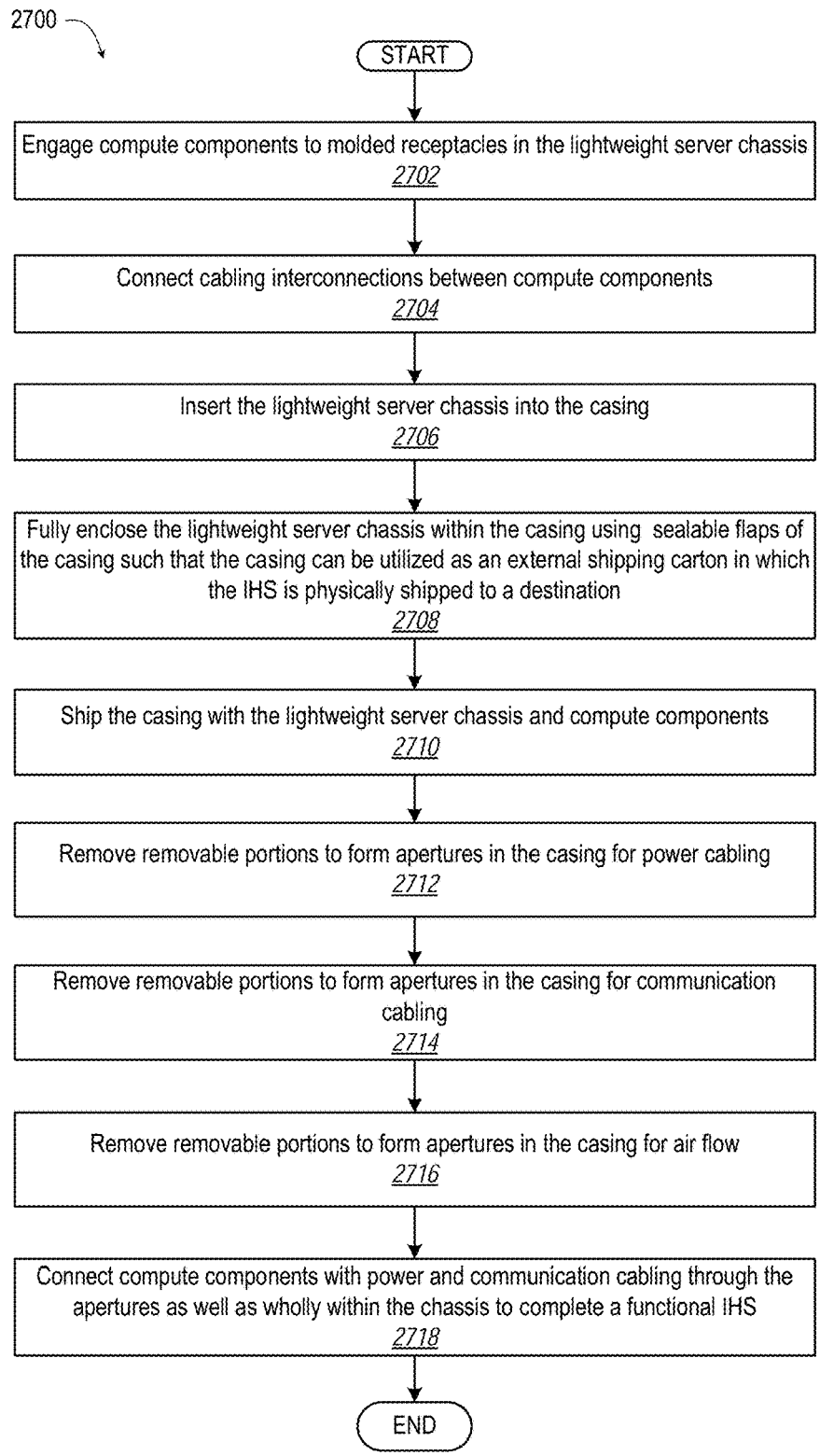
FIG. 27 illustrates a flow diagram of a method of using the casing and chassis provided by the method of FIG. 26, according to one embodiment.

FIG. 27 illustrates a method of using the casing and chassis provided by method 2600 (FIG. 26). In one embodiment, the method 2700 includes engaging compute components into the molded receptacles in the LWS chassis (block 2702). Method 2700 includes connecting cabling interconnections between compute components (block 2704). Method 2700 further includes inserting the LWS chassis into the casing (block 2706). Method 2700 further includes fully enclosing the LWS chassis within the casing using sealable flaps of the casing such that the casing can be utilized as an external shipping carton in which the IHS 100 is physically shipped to a destination (block 2708). In one embodiment, the method 2700 includes shipping the assembled IHS 100, including the casing with the LWS chassis and compute components (block 2710).

At the customer location, method 2700 may further include removing a removable portion to form apertures in the casing for power cabling (block 2712). As another example, the method 2700 may further include removing a removable portion to form apertures in the casing for communication cabling (block 2714). As yet another example, the method 2700 may further include removing a removable portion to form apertures in the casing for air flow (block 2716). The method 2700 can further include forming rack engagement features into an exterior of one of the casing and the LWS chassis for rack mounting (block 2718). The apertures enable connecting the compute components with power and communication cabling through the apertures as well as wholly within the chassis to complete a functional IHS.

In the above described flow charts of FIG. 25-27, one or more of the methods may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A lightweight server (LWS) chassis comprising:
    a base panel molded from a pliable, lightweight material and having a chassis surface that includes molded receptacles that define engageable surfaces of a plurality of slots formed within the chassis surface, each slot configured and sized to support modular insertion of an end user selectable compute component from among a plurality of different end user selectable compute components that are insertable into respective slots of the LWS chassis, the LWS chassis manufactured and shipped separately from the end user selectable compute components, including processing components, to enable downstream provisioning and assembly of a fully functional information handling system (IHS) at an end user location using the separately shipped LWS chassis and one or more of the end user selectable compute components;
    a casing having a removable portion which, when removed after shipping of the LWS chassis, enables exterior access to the chassis surface and to one or more modular, functional compute components placed on the chassis surface prior to shipping and enables access to insert one or more end user selectable compute components after shipping, wherein the base panel can be slideably inserted into an open end of the casing when the casing has been assembled; and
    at least one impact absorbent material pad attached to an interior surface of the casing, the impact absorbent material pad serving as void fill to firmly hold in place the modular, functional compute components during shipping;
    wherein the molded receptacles of the LWS chassis are sized to selectively receive more than one type of compute component, providing configurability at a customer location, after the LWS chassis is shipped, wherein the LWS chassis is configured to enable an end user to insert the end user selected compute components and complete interconnections at the customer location in order to configure the functional IHS that meets end user requirements.

2. The LWS chassis of claim 1, wherein the pliable, lightweight material comprises biodegradable material.

3. The LWS chassis of claim 1, further comprising rack engagement features for the LWS chassis to be mounted within a rack at an end user location following shipping of the LWS chassis.

4. The LWS chassis of claim 1, wherein each slot comprises a molded receptacle to engageably receive a selected specific compute component, wherein the compute components are themselves configured to fit within one or more of the slots in the surface of the LWS chassis, wherein the fully functional IHS is provided when the end user selectable compute components are (i) inserted into the LWS chassis in their respective slots after the LWS chassis is shipped to the end user, (ii) communicatively interconnected in the LWS chassis via required communication and power cabling, and (iii) provided with required power to operate.

5. The LWS chassis of claim 1, further comprising a chassis cover that is shipped along with or separately from the base panel of the LWS chassis and fits on top of the base panel to enclose the compute components.

6. The LWS chassis of claim 5, wherein:
    the base panel comprises lateral sides;
    the chassis cover comprises lateral flanged edges to contact a top surface of the lateral sides; and
    the LWS chassis comprises respective male and female contacting features to align and engage the chassis cover to the base panel.

7. The LWS chassis of claim 5, wherein the base panel and the chassis cover opposingly contact an inserted modular, functional compute component to retain the inserted modular, functional compute component in a corresponding slot and prevent dislodging of the compute component if the LWS chassis is impacted.

8. The LWS chassis of claim 5, wherein the chassis cover comprises at least one air flow baffle for directing air flow past a selected compute component within the chassis.

9. The LWS chassis of claim 1, further comprising a lightweight, impact absorbent material.

10. The LWS chassis of claim 1, wherein the LWS chassis provides structural rigidity to maintain shape during shipping and during functional use after shipping and assembly.

11. The LWS of claim 1, further comprising material incorporated into the LWS chassis that can withstand static weight loads, expected moisture exposure, expected temperature range exposure, expected vibration, and impact loads.

12. The LWS chassis of claim 1, wherein the plurality of slots are sized to selectively receive more than one type of user selectable compute component, thereby providing configurability at the customer location at which the IHS is assembled.

13. The LWS chassis of claim 1, wherein the pliable material comprises at least one of a thermoplastic or an epoxy resin.

14. The LWS chassis of claim 1, wherein, at least one of a textile fabric or a biodegradable matrix is embedded into the pliable material to create a biodegradable material.

15. The LWS chassis of claim 1, wherein the pliable material is a cellulose-based product that is molded and cured into a structurally rigid shape.

16. The LWS chassis of claim 1, wherein the casing comprises removable portions defined by one or more perforated segments that can be removed to leave apertures that enable exterior access to components inside of the casing.

17. The LWS chassis of claim 1, further comprising:
    shielding material for shielding a user from electromagnetic interference (EMI) generated by the modular, functional compute components and for shielding the modular functional computer components from electrostatic damage; and
    a coating comprising a flame retardant and a heat resistant material, wherein the LWS chassis is selectively coated with a material that is flame retardant and heat resistant to mitigate hazards from compute components that can reach high temperatures.

18. An information handling system (IHS) comprising:
a lightweight server (LWS) chassis having a chassis surface that includes a plurality of slots formed within the chassis surface, each slot configured and sized to support modular insertion of a compute component from among a plurality of different compute components that are insertable into respective slots of the LWS chassis for downstream provisioning and assembly of a fully functional IHS using the LWS chassis and end user selectable compute components;
a casing having a removable portion which, when removed after shipping of the LWS chassis, enables exterior access to the chassis surface and to one or more modular, functional compute components placed on the chassis surface prior to shipping and enables access to insert one or more end user selectable compute components after shipping, wherein a base panel of the LWS chassis can be slideably inserted into an open end of the casing when the casing has been assembled;
at least one impact absorbent material pad attached to an interior surface of the casing, the impact absorbent material pad serving as void fill to firmly hold in place the modular, functional compute components during shipping;
at least two compute components inserted into respective slots of the LWS chassis; and
one or more connecting cabling interconnecting the at least two compute components.

19. The IHS of claim 18, wherein:
the LWS chassis is molded from a pliable material; and
each slot comprises a molded receptacle to engageably receive a selected functional compute component.

20. The IHS of claim 18, further comprising a rack, wherein the LWS chassis comprises rack engagement features for the LWS chassis to be mounted within the rack.

21. The IHS of claim 18, wherein:
the LWS chassis comprises a chassis cover that fits on top of the base panel to enclose the compute components; and
the LWS chassis comprises biodegradable material and shielding material for shielding a user from electromagnetic interference (EMI) generated by the modular, functional compute components and shielding the modular functional computer components from electrostatic damage.

22. The IHS of claim 18, wherein:
the base panel has lateral sides;
the LWS chassis comprises a chassis cover lateral flanged edges and that fits on top of the base panel along a top surface of the lateral sides to enclose the compute components;
the LWS chassis comprises respective male and female contacting features to align and engage the chassis cover to the base panel;
the base panel and the chassis cover opposingly contact an inserted modular, functional compute component to retain the inserted modular, functional compute component in a corresponding slot and prevent dislodging of the compute component if the LWS chassis is impacted;
the chassis cover comprises at least one air flow baffle for directing air flow past a selected functional compute component within the LWS chassis; and
the LWS chassis comprises a lightweight, impact absorbent material.

23. A method of provisioning a lightweight server (LWS) chassis for modular insertion of compute components for downstream assembly of an information handling system (IHS), the method comprising:
forming a LWS chassis having a base panel and a chassis surface that includes a plurality of slots formed within the chassis surface and each sized for modular insertion of a customer selectable specific compute component of a plurality of different compute components for downstream assembly of a fully functional IHS; and
providing a casing having a removable portion which, when removed after shipping of the LWS chassis, enables exterior access to the chassis surface and to one or more modular, functional compute components placed on the chassis surface prior to shipping and enables access to insert one or more customer selectable compute components after shipping, wherein the base panel of the LWS chassis can be slideably inserted into an open end of the casing when the casing has been assembled, the casing having at least one impact absorbent material pad attached to an interior surface of the casing, the impact absorbent material pad serving as void fill to firmly hold in place the modular, functional compute components during shipping.

24. The method of claim 23, further comprising:
interconnecting compute components in the LWS chassis via one or more connecting cables; and
applying power to a power component within the LWS chassis to enable the compute components to collectively function as the fully functional IHS.

25. The method of claim 23, wherein forming the LWS chassis further comprises molding the LWS chassis and the plurality of slots from a pliable, biodegradable material.

26. The method of claim 23, wherein forming the LWS chassis further comprises providing rack engagement features for the LWS chassis to be mounted within a rack.

27. The method of claim 23, wherein forming the LWS chassis further comprises:
molding the base panel in which the compute components are inserted;
configuring a chassis cover that fits on top of the base panel to enclose the compute components; and
contouring an inner surface of the chassis cover to form at least one air flow baffle for directing air flow past a selected functional compute component within the LWS chassis.

28. The method of claim 27, wherein forming the LWS chassis comprises incorporating shielding material for shielding a user from electromagnetic interference (EMI) generated by the modular, functional compute components and for shielding the modular functional computer components from electrostatic damage.

29. The method of claim 27, further comprising molding at least the base panel using a lightweight, impact absorbent material and configuring the chassis cover to provide opposing contact for an inserted modular, functional compute component by the base panel and the chassis cover to prevent dislodging of the inserted modular, functional compute component in the corresponding slot if the LWS chassis is impacted.

* * * * *